United States Patent
Pretl et al.

(10) Patent No.: US 9,484,854 B2
(45) Date of Patent: Nov. 1, 2016

(54) APPARATUS AND METHOD FOR PROVIDING OSCILLATOR SIGNALS

(71) Applicant: Intel IP Corporation, Santa Clara, CA (US)

(72) Inventors: Harald Pretl, Schwertberg (AT); Guenther Haberpeuntner, Linz (AT); Volker Neubauer, Linz (AT); Svetozar Broussev, Linz (AT); Andreas Mayer, Gramastetten (AT); Andreas Puerstinger, Engerwitzdorf (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/580,952

(22) Filed: Dec. 23, 2014

(65) Prior Publication Data
US 2016/0156310 A1    Jun. 2, 2016

(30) Foreign Application Priority Data
Nov. 28, 2014    (DE) ................. 20 2014 105 774 U

(51) Int. Cl.
| | |
|---|---|
| H03L 7/00 | (2006.01) |
| H03B 1/00 | (2006.01) |
| H03L 7/23 | (2006.01) |
| H03L 7/18 | (2006.01) |
| H03L 7/099 | (2006.01) |
| H03L 7/04 | (2006.01) |
| H03L 7/07 | (2006.01) |
| G06F 1/02 | (2006.01) |
| H04B 1/40 | (2015.01) |

(52) U.S. Cl.
CPC ............... *H03B 1/00* (2013.01); *G06F 1/022* (2013.01); *H03L 7/04* (2013.01); *H03L 7/07* (2013.01); *H03L 7/099* (2013.01); *H03L 7/18* (2013.01); *H03L 7/23* (2013.01); *H04B 1/40* (2013.01)

(58) Field of Classification Search
CPC ........... H03L 7/23; H03L 7/099; H03L 7/18; H03L 7/04
USPC ........ 455/260, 258, 76, 296; 331/2, 46, 185, 331/16
See application file for complete search history.

(56) References Cited

U.S. PATENT DOCUMENTS 7,747,237 B2 *  6/2010  Ali ........................... H03L 7/22
                                                              331/2

* cited by examiner

*Primary Examiner* — Arnold Kinkead
(74) *Attorney, Agent, or Firm* — Eschweiler & Associates, LLC

(57) ABSTRACT

An apparatus for providing oscillator signals includes an oscillator circuit configured to generate a first oscillator signal with a first oscillator signal frequency for a frequency conversion of a first signal to be converted and to generate a second oscillator signal with a second oscillator signal frequency for a frequency conversion of a second signal to be converted. The oscillator circuit is configured to enable the generation of the first oscillator signal with the first oscillator signal frequency and the second oscillator signal with the second oscillator signal frequency based on at least two different possible oscillator circuit configurations. The control circuit is configured to select, based on the first oscillator signal frequency and the second oscillator signal frequency, one of the possible oscillator circuit configurations of the oscillator circuit for generating the first oscillator signal and the second oscillator signal.

23 Claims, 11 Drawing Sheets

APPARATUS AND METHOD FOR PROVIDING OSCILLATOR SIGNALS

TECHNICAL FIELD

The present disclosure relates to the generation of oscillator signals and in particular to apparatuses and methods for providing oscillator signals.

BACKGROUND

Simultaneously running long term evolution (LTE) transceivers in Carrier Aggregation (CA) mode may place two receivers in different chips, which provides isolation between the independently running digitally controlled oscillators and local oscillators. This may lead to high cost, high printed circuit board area, a limitation in the number of supported frequency band combinations, a difficult implementation of non-contiguous intra-band CA, and an increase in volume of the final product, for example. On the other hand, the placement of several oscillators on the same chip may cause large cross-talk.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
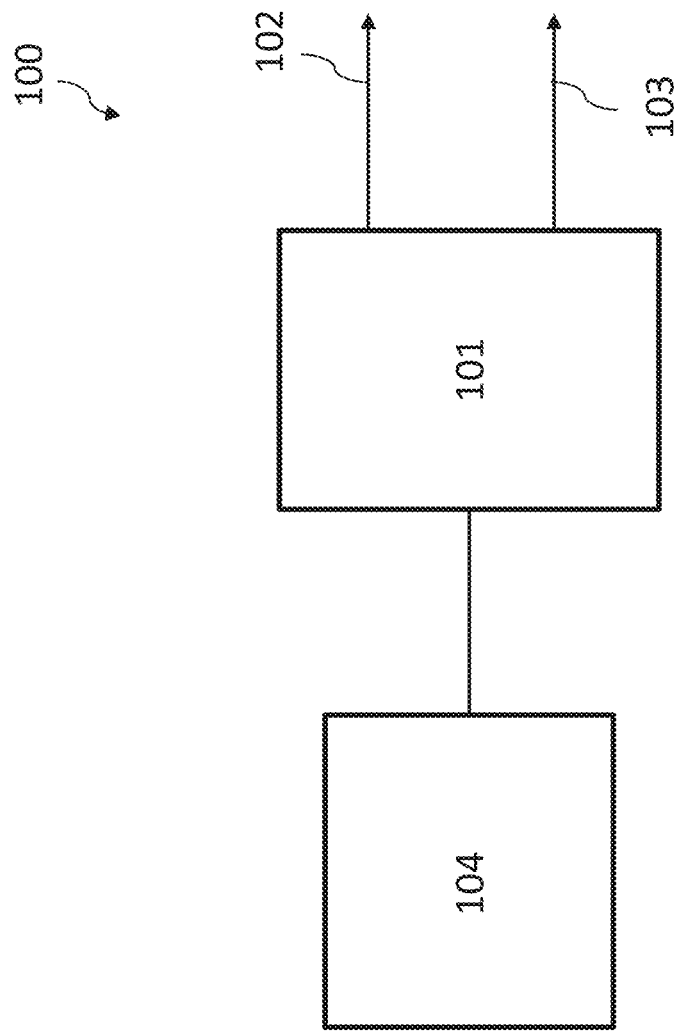
FIG. 1 shows a schematic illustration of an apparatus for providing oscillator signals.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In the following, various examples relate to devices (e.g. mobile device, cell phone, base station) or components (e.g. transmitter, transceiver) of devices used in wireless or mobile communications systems.

A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 shows a schematic illustration of an apparatus 100 for providing oscillator signals according to an example.

The apparatus 100 includes an oscillator circuit 101 configured to generate a first oscillator signal 102 with a first oscillator signal frequency for a frequency conversion of a first signal to be converted and to generate a second oscillator signal 103 with a second oscillator signal frequency for a frequency conversion of a second signal to be converted.

The oscillator circuit 101 is configured to enable the generation of the first oscillator signal 102 with the first oscillator signal frequency and the second oscillator signal 103 with the second oscillator signal frequency based on at least two different possible oscillator circuit configurations.

The apparatus 100 further includes a control circuit 104 configured to select, based on the first oscillator signal frequency and the second oscillator signal frequency, one of the possible oscillator circuit configurations of the oscillator circuit for generating the first oscillator signal 102 and the second oscillator signal 103.

Due to the generation of oscillator signals based on by different oscillator circuit configurations, cross-talk interferences may be reduced in the apparatus and/or in a transmitter and/or transceiver in which the apparatus is implemented. For example, oscillator circuit configurations predicted to cause significant increase cross-talk interferences may be avoided, and improved oscillator circuit configurations may be used to generate the oscillator signals.

The apparatus 100 may be configured to provide or generate oscillator signals (e.g. local oscillator LO signals) for a transmitter, a receiver or a transceiver, which may be configured to transmit signals (e.g. high frequency or radio frequency signals) and/or to receive signals (e.g. baseband signals), for example. The apparatus 100 may be implemented in a cell phone or a mobile device, for example. The apparatus 100 may be implemented on or may be a semiconductor chip or die including circuitry for providing or generating the oscillator signals, for example.

The oscillator circuit 101 of the apparatus 100 may be an oscillator circuit for generating local oscillator signals (LO) signals, for example. The oscillator circuit 101 may include oscillator circuit modules and other circuit components (e.g. mixers, amplifiers and a plurality of frequency dividers) for generating the first oscillator signal 102 and the second oscillator signal 103, for example. The first oscillator signal 102 may be mixed (e.g. using a frequency mixer circuit) with the first signal to be converted to produce a first baseband receive (output) signal for example. The second oscillator signal 103 may be mixed (e.g. using a frequency mixer circuit) with the second signal to be converted to produce a second baseband receive (output) signal, for example.

An oscillator circuit configuration may include an arrangement of circuit components of the oscillator circuit for generating the first oscillator signal (e.g. at the first oscillator signal frequency LO1) and the second oscillator signal (e.g. at the second oscillator signal frequency LO2). For example, an oscillator circuit configuration (or each oscillator circuit configuration) may include a first partial oscillator circuit configuration (e.g. a first controlled oscillator module coupled to at least one first frequency adjustment circuit) for generating the first oscillator signal and a second partial oscillator circuit configuration (e.g. a second controlled oscillator module coupled to a second frequency adjustment circuit) for generating the second oscillator signal, for example.

A possible oscillator circuit configuration may include a first controlled oscillator module coupled to at least one first frequency adjustment circuit to generate the first oscillator signal, and a second controlled oscillator module coupled to a second frequency adjustment circuit to generate the second oscillator signal.

Each controlled oscillator module may include a variable controlled oscillator VCO or a digital controlled oscillator DCO, which may be part of a phase locked loop module or circuit, which may be configured to generate a controlled oscillator signal at a controlled oscillator frequency (e.g. $f_{DCO}$), for example. The first frequency adjustment circuit may be selected from a first plurality of frequency adjustment circuits, and the second frequency adjustment circuit may be selected from a second plurality of frequency adjustment circuits, for example.

In an oscillator circuit configuration, the oscillator circuit may be configured to generate one of the first oscillator signal and the second oscillator signal based on a first controlled oscillator signal generated by the first controlled oscillator module at a first controlled oscillator signal frequency (e.g. $f_{DCO1}$) and frequency adjusted (e.g. frequency divided) by a first frequency adjustment factor (e.g. an integer from 1 to n) associated with at least one first frequency adjustment circuit. The oscillator circuit 201 may be configured to generate the other of the first oscillator signal and the second oscillator signal based on a second controlled oscillator signal generated by the second controlled oscillator module at a second controlled oscillator signal frequency (e.g. $f_{DOC2}$) and frequency adjusted (e.g. frequency divided) by a second frequency adjustment factor (e.g. an integer from 1 to n) associated with at least one second frequency adjustment circuit.

A different oscillator circuit configuration may refer to an arrangement of the circuit components of the oscillator circuit to generate the first oscillator signal (e.g. at the same first oscillator signal frequency LO1) and the second oscillator signal (e.g. at the second oscillator signal frequency LO2), using a different arrangement (or pairing) of circuit components of the oscillator circuit.

In the different oscillator circuit configurations, different parts of the oscillator circuit may be configured differently. In the plurality of possible oscillator circuit configurations, each possible oscillator circuit configuration may differ in that at least one of the first frequency adjustment circuit, the second frequency adjustment circuit, a first controlled oscillator signal frequency associated with the first controlled oscillator module and a second controlled oscillator signal frequency associated with the second controlled oscillator module may be different.

The plurality of different possible oscillator circuit configurations allow for (local) oscillator signals to be generated based on different pairings or combinations (e.g. different DCO/VCO frequency selections and frequency dividers), for example. For example, frequency adjustable controlled oscillator modules (e.g. DCOs or VCOs) configured to generate the controlled oscillator signal may be paired or combined with an appropriate frequency adjustment circuit to produce the required local oscillator signals at the required frequencies. The first controlled oscillator module (e.g. a DCO or a VCO) and the second controlled oscillator module (e.g. a DCO or a VCO) may each be configured to generate a controlled oscillator signal with adjustable oscillator signal frequency. This may be carried out by varying a voltage input for a voltage controlled oscillator or a digital signal for a digitally controlled oscillator to adjust the controlled oscillator frequency of the controlled oscillator signal.

In the plurality of different possible oscillator circuit configurations, a controlled oscillator signal having a different controlled oscillator frequency may be generated by the controlled oscillator module (e.g. of the DCO/VCO) and may be frequency divided by a different frequency divider to produce the required oscillator signal at the required frequency. By providing the different possible oscillator circuit configurations for the generation of the first oscillator signal and the second oscillator signal, cross-talk between circuit components may be reduced or avoided, for example.

In the plurality of different possible oscillator circuit configurations, the first controlled oscillator module and the second controlled oscillator module may be used interchangeably for generating the first oscillator signal and the second oscillator signal. For example, in a first oscillator circuit configuration of the plurality of different possible oscillator circuit configuration, the first controlled oscillator module may be used for the generation of the first oscillator signal. For example, in the first oscillator circuit configuration, the controlled oscillator module may be adjusted to generate the controlled oscillator signal with a first controlled oscillator signal frequency for the generation of the first oscillator signal. In a second oscillator circuit configuration, of the plurality of different possible oscillator circuit configuration the second controlled oscillator module may be used for the generation of the first oscillator signal. For example, in the second oscillator circuit configuration, the controlled oscillator module may be adjusted to generate the controlled oscillator signal with a second controlled oscillator signal frequency for the generation of the first oscillator signal.

In the plurality of different possible oscillator circuit configurations, the first plurality of frequency adjustment circuits and the second plurality of frequency adjustment circuit may be used interchangeably for generating the first oscillator signal and the second oscillator signal. For example, in a first oscillator circuit configuration of the plurality of different possible oscillator circuit configurations, a first frequency adjustment circuit of a first plurality of frequency adjustment circuits may be used for the generation of the first oscillator signal. In a second oscillator circuit configuration of the plurality of different possible oscillator circuit configuration, a second frequency adjustment circuit of a second plurality of frequency adjustment circuits may be used for the generation of the first oscillator signal.

In the plurality of different possible oscillator circuit configurations, the control circuit 104 may be configured to select a first oscillator circuit configuration for the generation of the first oscillator signal with the first oscillator signal frequency being a first frequency and the second oscillator signal with the second oscillator signal frequency being a second frequency. The control circuit 104 may be configured to select a second oscillator circuit configuration for the generation of the first oscillator signal with the first oscillator signal frequency being a first frequency and the second oscillator signal with the second oscillator signal frequency being a third frequency, where the second frequency and the third frequency are different. The first oscillator circuit configuration may include the first partial oscillator circuit configuration being different from the first partial oscillator circuit configuration of the second oscillator circuit configuration. For example, an oscillator circuit configuration of a first part of the oscillator circuit may be different in the first oscillator circuit configuration and in the second oscillator circuit configuration.

The plurality of different possible oscillator circuit configurations may include a default oscillator circuit configuration for the generation of the first oscillator signal with the first oscillator frequency and the second oscillator signal with the second oscillator frequency, and at least one cross-talk related oscillator circuit configuration for the generation of the first oscillator signal with the first oscillator frequency and the second oscillator signal with the second oscillator frequency if a predefined cross-talk criteria is fulfilled.

The control circuit 104 may be configured to select a possible oscillator circuit configuration based on whether a predefined cross-talk criteria/condition is fulfilled, for example. The control circuit 104 may be configured to select a possible oscillator circuit configuration of the oscillator circuit from a plurality of predetermined possible oscillator circuit configurations, which may be stored in a memory module (e.g. a non-volatile memory).

The control circuit 104 may be configured to select a possible oscillator circuit configuration (or to determine whether a predefined cross-talk criteria/condition is fulfilled) based on the first oscillator signal frequency (e.g.

LO1) and the second oscillator signal frequency (e.g. LO2) of the oscillator signals to be generated, for example. In one example, the control circuit comprises a memory module or unit storing the plurality of different possible oscillator circuit configurations associated with the input frequency values in a look up table, for example.

The control circuit 104 may be configured to search the look up table based on the first oscillator signal frequency (e.g. LO1) and the second oscillator signal frequency (e.g. LO2) being input frequency parameter values, for example. The memory module may provide control signals for selecting a specific oscillator circuit configuration based on the first oscillator signal frequency (e.g. LO1) and the second oscillator signal frequency (e.g. LO2) being input frequency parameter values of the look up table. The possible oscillator circuit configurations stored in the memory module are those related to the input frequency values LO1 and LO2 if a predetermined cross-talk condition is met based on a cross-talk building law.

The control circuit 104 may be configured to select a possible oscillator circuit configuration based on cross-talk information indicating whether oscillator circuit configurations are stored in the look up table or the memory module. The oscillator circuit configurations stored by the look up table may be derivable based on the cross-talk building law, which may be based on the selected first oscillator signal frequency and the second oscillator signal frequency, for example.

In one example of a cross-talk building law, the control circuit 104 may be configured to select a possible oscillator circuit configuration based on a baseband frequency bandwidth of an output baseband signal to be generated by the apparatus, for example. For example, the control circuit 104 may be configured to select a possible oscillator circuit configuration if the linear combination of the product of the first frequency coefficient and the first oscillator signal frequency and the product of the second frequency coefficient and the second oscillator signal frequency falls below half of a baseband frequency bandwidth of an output baseband signal to be generated by the apparatus. This condition may indicate that a predetermined cross-talk condition associated with the first oscillator frequency and the second oscillator frequency is fulfilled, for example. In other words, the control circuit 104 may be configured to select a possible oscillator circuit configuration based on the linear combination of the first oscillator signal frequency and the second oscillator signal frequency based on the cross-talk building law, for example.

In some examples, the control circuit 104 may be configured to select a default oscillator circuit configuration of the plurality of different possible oscillator circuit configurations if the cross-talk related information indicates that no predetermined cross-talk conditions is present (or stored in the memory module) based on the (input) first oscillator signal frequency and the second oscillator signal frequency or if no cross-talk issues are predicted based on the frequency harmonics of the first and the second oscillator signal frequency. For example, the cross-talk information related to the selected first oscillator signal frequency and the second oscillator signal frequency may indicate that no cross-talk building law related to the input first oscillator signal frequency and the input second oscillator signal frequency is found in the look up table. This may cause the control circuit to select the default oscillator circuit configuration.

The control circuit 104 may be configured to repeat the search and selection process for each new channel frequency, (e.g. when a new LO1 and/or new LO2 is required).

For example, when a new pair of channels are selected (e.g. a new LO1 and/or new LO2) the control circuit may be configured to select between different oscillator circuit configurations as different LO frequency pairs (e.g. based on the input frequency parameter values) may be expected to be associated with different cross-talk issues or conditions.

The control circuit 104 may be configured to control (an adjustment of) a first controlled oscillator signal frequency (e.g. $f_{DCO1}$) of a first controlled oscillator signal generated by the first controlled oscillator module and a second controlled oscillator signal frequency (e.g. $f_{DCO2}$) of a second controlled oscillator signal generated by the second controlled oscillator module based on the oscillator circuit configuration selected by the control circuit 104 once an oscillator circuit configuration has been selected, for example.

The presence of cross-talk issues may arise or be predicted to arise based on the first oscillator signal frequency (e.g. LO1) and the second oscillator signal frequency (e.g. LO2) of the signals to be generated by the oscillator circuit 101. For example, cross-talk issues may arise or be predicted to arise due to interferences between the circuit components. For example, cross-talk may result due to capacitive, inductive, or conductive coupling between the circuit components. Depending on the oscillation frequencies of the oscillator signals to be generated or provided, cross-talk issues may be expected to be present in some cases or no cross-talk issues may be expected in some cases. The presence of a cross-talk issue may be determined or predicted based on a cross-talk building law which may be described by a linear combination (e.g. an addition or subtraction) of the first oscillator signal frequency (e.g. LO1 frequency) and the second oscillator signal frequency (e.g. LO2 frequency), for example. The linear combination may be based on an addition or subtraction of frequency harmonics of the first oscillator signal frequency and the second oscillator signal frequency, for example.

The presence of a cross-talk issue may be identified or expected if a certain channel combination or certain pairs of oscillator signal frequencies (e.g. LO1, LO2) are selected or needed to be generated, for example. Cross-talk interferences may be predicted based on the cross-talk building law if frequency harmonics of the first oscillator signal frequency and the second oscillator signal frequency or if linear combinations of frequency harmonics of the first oscillator signal frequency and the second oscillator signal frequency are expected to interfere with an output signal to be generated, for example. For example, the presence of a cross-talk issue may be identified or expected if the linear combination of (harmonics of) the first oscillator signal frequency and the second oscillator signal frequency lies within half of a baseband frequency bandwidth of an output baseband signal to be generated by the apparatus, or close to a transmit frequency, for example.

One such cross-talk building law may be if an absolute value of a linear combination of the product of the first frequency coefficient and the first oscillator signal frequency and the product of the second frequency coefficient and the second oscillator signal frequency e.g. abs (m×LO1±n× LO2) lies within a frequency range of interest—for example, if the linear combination of frequencies falls below or is close to half of a baseband frequency bandwidth of an output baseband signal to be generated by the apparatus, e.g. if $$\text{abs}(m \times LO1 \pm n \times LO2) < \frac{BW}{2}.$$

LO1 represents a LO frequency of a primary receiver, LO2 represents a LO frequency of a secondary receiver and the function abs( ) refers to an absolute value. The frequency coefficients m and n are integer numbers representing either a harmonic order or a frequency division, for example.

A further cross-talk building law may be if an absolute value of a linear combination of the product of the first frequency coefficient and the first oscillator signal frequency and the product of the second frequency coefficient and the second oscillator signal frequency is close to (e.g. within ±10 MHz) of a transmission frequency, $f_{tx}$, of a signal to be transmitted by the apparatus, or a transmitter, or transceiver in which the apparatus is implemented, e.g. if abs(m× LO1±n×LO2)≈$f_{tx}$.

A further cross-talk building law may be if an absolute value of a linear combination of the product of the first frequency coefficient and the first oscillator signal frequency, the product of the second frequency coefficient and the second oscillator signal frequency, and the product of a third frequency coefficient and a transmission frequency e.g. abs(m×LO1±n×LO2+k$f_{tx}$) lies within a frequency range of interest- for example, if the linear combination of frequencies falls below or is close to half of a baseband frequency bandwidth of an output baseband signal to be generated by the apparatus, e.g. if $$\text{abs}(m \times LO1 \pm n \times LO2 + k f_{tx}) < \frac{BW}{2},$$

where k is an integer number representing either a harmonic order or a frequency division, for example.

A further cross-talk building law may be if an absolute value of a linear combination of the product of the first frequency coefficient and the first oscillator signal frequency, the product of the second frequency coefficient and the second oscillator signal frequency, and a subtraction between a local oscillator transmission frequency and a transmission frequency e.g. abs(m×LO1±n×LO2+DUX) lies within a frequency range of interest- for example, if the linear combination of frequencies falls below or is close to half of a baseband frequency bandwidth of an output baseband signal to be generated by the apparatus, e.g. if $$\text{abs}(m \times LO1 \pm n \times LO2 + DUX) < \frac{BW}{2}$$

where DUX=LO−$f_{tx}$.

Depending on the implementation, carrier aggregation may be two-fold (with only two different LO frequencies being generated) or multi-fold (with more than two different LO frequencies being generated). For multi-fold carrier aggregation, the cross-talk building laws may be expressed more generally as $$\text{abs}\left(\sum (n_i \times LO_i +) + n_t \times f_{tx}\right) < \frac{BW}{2},$$

abs(Σ($n_i$×$LO_i$+)+$n_t$×$f_{tx}$)≈$f_{tx}$, $$\text{abs}\left(\sum (n_i \times LO_i +)\right) < \frac{BW}{2} \text{ or } \text{abs}\left(\sum (n_i \times LO_i +) + DUX\right) < \frac{BW}{2},$$

where n represents the harmonic order or a frequency division and i represents the number of carrier frequencies to be generated.

In some examples the frequency range of interest for the cross-talk building law may be based on or may be affected by resource block allocation, signal statistics, empty sub carriers or base band algorithms to overcome spurs at certain offsets (e.g. 15 kHz nulling).

The control circuit 104 may also be configured to determine based on the cross-talk building law (e.g. based on the coefficients or frequency harmonics of the signal frequencies, and the circuit components generating the first and the second oscillator signal) whether a cross-talk is related to the oscillator circuit modules (e.g. digitally controlled oscillators or voltage controlled oscillators) or to other parts or components (e.g. to mixers, amplifiers or frequency dividers) of the oscillator circuit. For example, the first frequency coefficient m and the second frequency coefficient n of the cross-talk building law may be used by the control circuit 104 to determine if a cross-talk is related to the oscillator circuit modules or to other parts or components of the oscillator circuit.

As an example, if a first frequency coefficient of the first oscillator signal frequency is equal to a frequency division between a first controlled oscillator signal frequency and the first oscillator signal frequency (LO1) or if a second frequency coefficient of the second oscillator signal frequency (LO2) is equal to a frequency division between a second controlled oscillator signal frequency and the second oscillator signal frequency, the control circuit 104 may determine that the cross-talk is related to at least one of the first controlled oscillator module and the second controlled oscillator module.

For example, if a cross talk building law is 3×LO1−2× LO2, and the oscillator circuit configuration is such that $f_{DCO}$=2 LO2, where $f_{DCO}$ is a frequency of a controlled oscillator signal generated by the controlled oscillator module, then the cross-talk is related to the controlled oscillator module for one of the receiver circuits (e.g. the cross-talk is VCO/DCO related).

If the first oscillator signal frequency (LO1) or if a second frequency coefficient of the second oscillator signal frequency (LO2) is not equal to a frequency division between a second controlled oscillator signal frequency and the second oscillator signal frequency, the control circuit 104 may determine that the cross-talk is not related to at least one of the first controlled oscillator module and the second controlled oscillator module, and may be attributed to other oscillator circuit components (e.g. the cross-talk is LO related).

The control circuit 104 may be configured to select a (different) oscillator circuit configuration so that a cross-talk issue related to (or caused by or attributed to) at least one of the first controlled oscillator module and the second controlled oscillator module is avoided. The control circuit 104 may select a different oscillator circuit configuration so that the cross-talk related to the oscillator module may be avoided or reduced. For example, to generate the oscillator signal LO2, the oscillator circuit configuration may be selected so that $f_{DCO}$=4 LO2. In some cases, the control circuit 104 may be configured to select a different oscillator circuit configuration until a cross-talk related to at least one of the first controlled oscillator module and the second controlled oscillator module is avoided.

Each possible oscillator circuit configuration may include information related to a combination or selection of oscillator circuit components used to generate the first oscillator signal at the first oscillator signal frequency and the second oscillator signal at the second oscillator signal frequency to avoid or reduce cross-talk, for example. Flexible LO generation (of LO signals) may be achieved by using different combinations of controlled oscillator frequencies (from DCOs) and frequency adjustors or dividers to avoid cross-talk related to the controlled oscillator modules, and is described further in FIG. 2.

Figure 2:
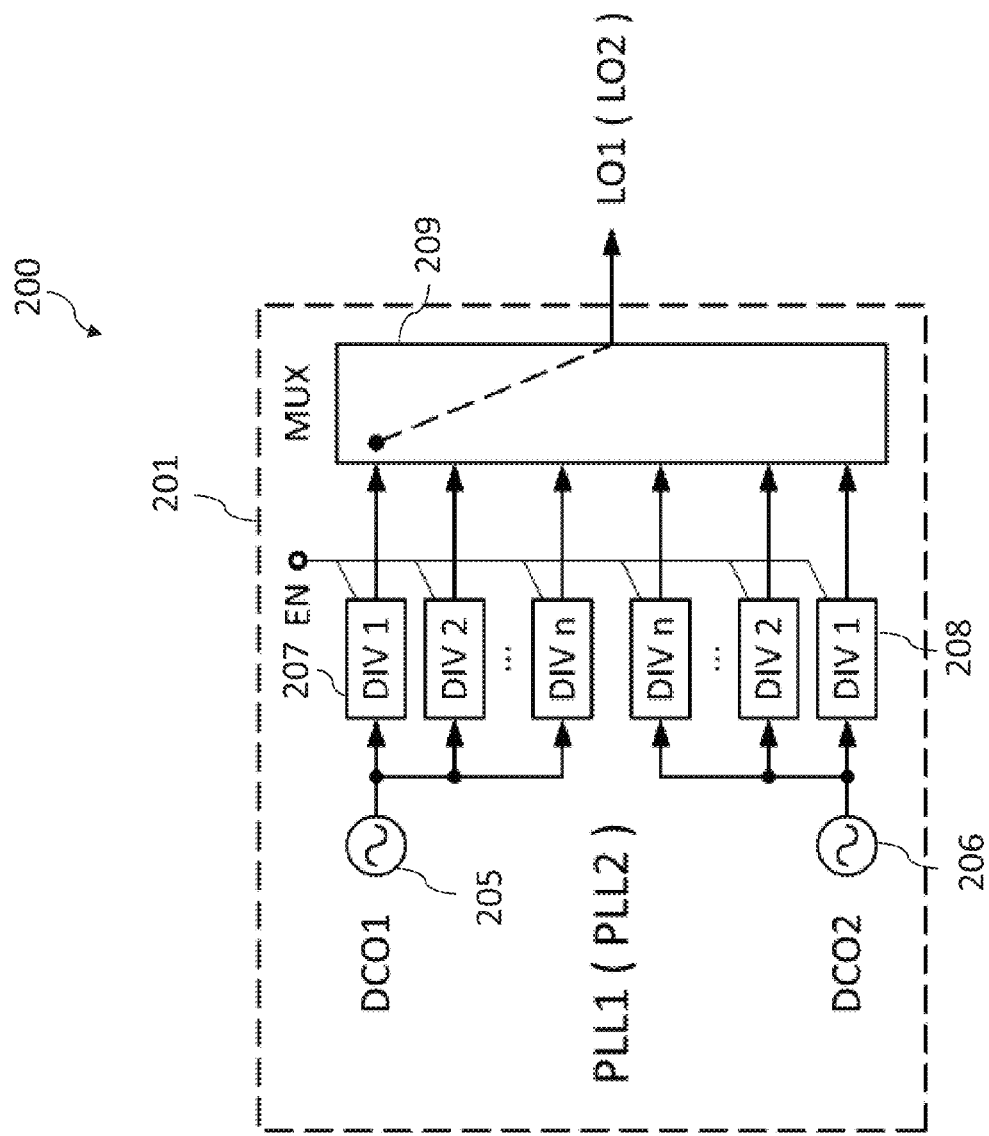
FIG. 2 shows a schematic illustration of an apparatus with controlled oscillator modules and frequency adjustment circuits for providing oscillator signals.

FIG. 2 shows a schematic illustration of a further apparatus 200 for providing oscillator signals according to an example. FIG. 2 shows band support with different combinations of DCOs and LO dividers and dynamic DCO Selection (DDS). Flexible LO generation (of LO signals) may be achieved with different DCOs and (frequency) dividers.

The apparatus 200 may include an oscillator circuit 201. The oscillator circuit 201 may include a first controlled oscillator module 205 and a second controlled oscillator module 206, for example. Each possible oscillator circuit configuration may be based on or may include a first controlled oscillator module coupled to at least one first frequency adjustment circuit selected from a plurality of frequency adjustment circuits 207 for the generation of one of the first oscillator signal and the second oscillator signal.

The oscillator circuit 201 may include a first partial oscillator circuit configuration, which may include the first controlled oscillator module 205 coupled to at least one first frequency adjustment circuit selected from a (e.g. first) plurality 207 of frequency adjustment circuits for the generation of the other of the first oscillator signal and/or the second oscillator signal. The oscillator circuit 201 may include a second partial oscillator circuit configuration, which may include the second controlled oscillator module 206 coupled to at least one second frequency adjustment circuit selected from a (e.g. second) plurality 208 of frequency adjustment circuits for the generation of the other of the first oscillator signal and the second oscillator signal.

Each frequency adjustment circuit may include or may be a frequency divider circuit (DIV 1 to DIV n) for adjusting a frequency of a controlled oscillator signal generated by a controlled oscillator module, wherein 1 to n represent integer factors (or divisors) of the frequency divider. In some examples, the divisors of the frequency dividers may be only even integers. In other examples, the divisors of the frequency dividers may be only odd integers. In some examples, the divisors may be a combination of both even and odd integers.

For example, in a first possible oscillator circuit configuration, the first oscillator signal (having a first oscillator frequency LO1) may be generated based on the first controlled oscillator module 205 (which generates a first controlled oscillator signal at a first controlled oscillator signal frequency $f_{DCO1}$) coupled to a first frequency adjustment circuit (e.g. DIV 2) 207, for example. Furthermore, in the first possible oscillator circuit configuration, the second oscillator signal (having a second oscillator frequency LO2) may be generated based on the second controlled oscillator module 206 (which generates a second controlled oscillator signal at a second controlled oscillator signal frequency $f_{DCO2}$) coupled to a second frequency adjustment circuit (e.g. DIV 4) 208, for example.

In a second possible oscillator circuit configuration, the first oscillator signal (having the first oscillator frequency LO1) may be generated based on the first controlled oscillator module 205 (which generates a first controlled oscillator signal at a controlled oscillator signal frequency $f_{DCO1(new)}$ different from the first controlled oscillator signal frequency $f_{DCO1}$) coupled to a frequency adjustment circuit (e.g. DIV 4) different from the first frequency adjustment circuit. Furthermore, the second oscillator signal (having the second oscillator frequency) may be generated based on a second controlled oscillator module 206 (which generates a second controlled oscillator signal at a controlled oscillator signal frequency $f_{DCO2(new)}$ different from the second controlled oscillator signal frequency $f_{DCO2}$) coupled to a frequency adjustment circuit (e.g. DIV 2) different from the second frequency adjustment circuit.

The oscillator circuit 201 may include at least one multiplexer circuit 209 configured to output at least one of the first oscillator signal and the second oscillator signal at an output terminal based on a selection of one of a plurality of multiplexer input signals provided by a plurality of frequency adjustment circuits.

A VCO/DCO related cross-talk (e.g. a cross-talk related to at least one of the first controlled oscillator module and the second controlled oscillator module) may be mitigated by programming the VCO/DCO (e.g. the controlled oscillator modules) to oscillate in another frequency domain and generating the desired LO frequency by using a different frequency divider, for example. The same principle may be accomplished by selecting another VCO/DCO (e.g. an alternative VCO/DCO) and the corresponding frequency divider (alternative divider), for example. The various examples may include multiple (or a plurality of) frequency dividers which are connected after each DCO.

The multiplexer (MUX) circuit 209 combines all divider outputs to a single LO output, for example. Furthermore, the MUX 209 may provide multiple outputs (e.g. High-Band (HB) output and Low-Band (LB) output) to provide improved operation for dedicated bands and to reduce design complexity, for example. Furthermore, the flexible LO generation scheme with different DCOs and dividers may be applied to both phased locked loops PLL1 and PLL2 in a transceiver circuit with two receiver circuits on a single chip, for example.

The exact LO frequencies (LO1 and LO2) are known during the power up procedure or during the update sequencing in the wireless transceiver, for example. All building laws involving DCOs may be evaluated (experimentally or analytically) beforehand in order to select an alternative DCO and alternative divider, and further stored into the non-volatile memory of the transceiver (or the apparatus). During a power-up procedure, the transceiver firmware may check whether there is an applicable DCO related building law with the selected LO1 and LO2 frequencies. If such a law exists, the firmware will load the predefined configuration for the DCO and divider such that a DCO-related cross-talk is avoided. Since the proposed methodology is band-dependent and channel-dependent, it may happen that the firmware may need to change a number of times the active DCO within a single band. This leads to Dynamic DCO Selection (DDS).

Various examples described herein relate to at least two transceiver circuits implemented on the same semiconductor chip. Although two transceivers (or receiver circuits) may also be physically separated by implementation in two different chips and isolation may be provided between the independently running DCOs and LOs, other complexities may occur. For example, high cost may be incurred due to the need of a second chip, and high printed circuit board (PCB) area may also be incurred. There may be limitations in the number of supported frequency band combinations. It may also be very difficult to implement non-contiguous intra-band carrier aggregation (CA). There may also be an increased volume of the final product. The examples described above and below avoid, reduce or eliminate these challenges, for example, when the transceivers are arranged on a common semiconductor chip.

The proposed DDS may use multiple frequency dividers, which may be seen as redundant and increasing silicon area above the minimum required. However, the penalty for such area increase is small due to the fact that inductorless frequency dividers occupy much smaller area than a VCO/DCO. Furthermore, the selection of frequency dividers may be narrowed down based on analytical expectations or hardware experiments. The flexibility provided by the described examples allows a complete removal of cross-talk generated by VCO/DCO interference, for example. The flexible concept allows selection of an improved DCO and divider configuration in the non-Carrier-Aggregation case to reduce power consumption, for example.

More details and aspects are mentioned in connection with the examples described above or below (e.g. the apparatus for providing oscillator signals, the oscillator circuit, the control circuit, the first oscillator signal, the second oscillator signal, the oscillator circuit configurations, the receiver circuits, the controlled oscillator module, the frequency adjustment circuits, the memory module, the cross-talk building laws, and the cross-talk information). The examples shown in FIG. 2 may comprise one or more optional additional features corresponding to one or more aspects mentioned in connection with the proposed concept or one or more examples described above (e.g. FIG. 1) or below (e.g. FIGS. 3 to 11).

Figure 3:
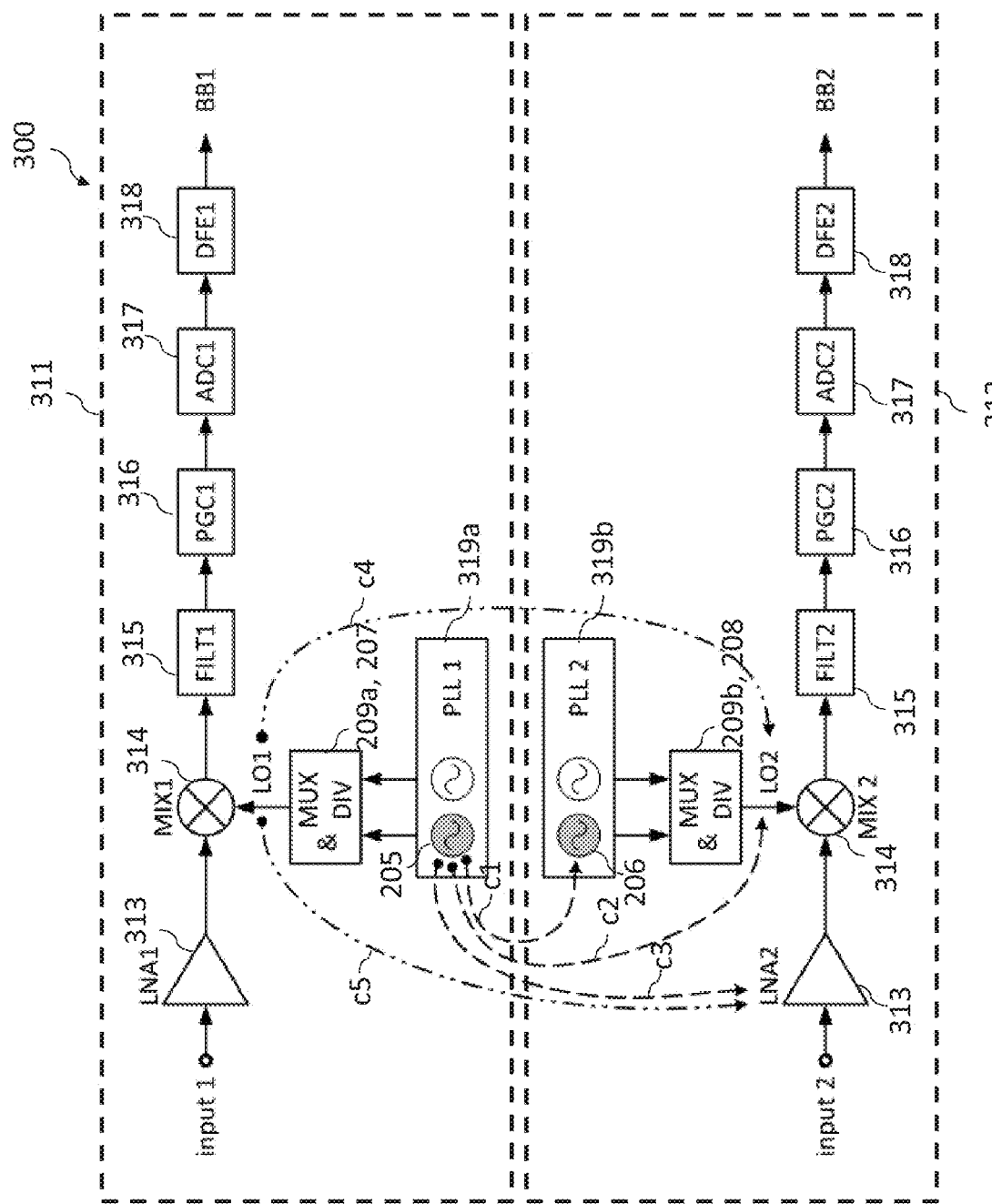
FIG. 3 shows a schematic illustration of an apparatus for providing oscillator signals illustrating different cross talk.

FIG. 3 shows a schematic illustration of an apparatus 300 for generating oscillator signals according to an example. The apparatus 300 may be part of a transceiver, a transmitter or a receiver circuit, for example. The apparatus 300 may be similar to the apparatuses described with respect to FIGS. 1 and 2. For example, the apparatus 300 may include one or more of the features already described with respect to FIGS. 1 and 2.

The apparatus 300 may include a first receiver circuit 311 configured to generate a first baseband receive signal BB1 based on the first radio frequency receive signal (e.g. at input 1) and the first oscillator signal LO1 with the first oscillator frequency.

The apparatus 300 may further include a second receiver circuit 312 configured to generate a second baseband receive signal BB2 based on the second radio frequency RF receive signal (e.g. at input 2) and the second oscillator signal LO2 having the second oscillator frequency.

Each receiver circuit may be composed of or may include a low-noise amplifier (LNA) 313, a mixer (MIX) 314, a filter (FILT) 315, a programmable gain control (PGC) 316, an analog-to-digital converter (ADC) 317, and digital front end (DFE) circuitry 318.

The apparatus 300 may include a first partial oscillator circuit configuration which may include a first controlled oscillator module 205 which may be part of a first phase locked loop circuit PLL 1 319a. The first partial oscillator circuit configuration may further include a first plurality of frequency adjustment circuits 207, a first multiplexer circuit 209a and other distribution elements for generating the (first) oscillator signal.

The apparatus 300 may further include a second partial oscillator circuit configuration which may include a controlled oscillator module 206 which may be part of a second phase locked loop circuit PLL 2 319b. The second partial oscillator circuit configuration may further include a second plurality of frequency adjustment circuits 208, a second multiplexer circuit 209b and other distribution elements for generating the (second) oscillator signal, for example.

The down-conversion LO signals (e.g. the first and the second oscillator signals) may be produced by the phase locked loop (PLL) 319, VCOs/DCOs (e.g. the controlled oscillator module) 205, 206, multiplexers (MUX) 209a, 209b and frequency dividers (DIV) 207, 208. Although the figure shows the first partial oscillator circuit configuration being configured generate the first oscillator signal LO1 and to provide the first oscillator signal to the first receiver circuit 311, and the second partial oscillator circuit configuration being configured generate the second oscillator signal LO2 and to provide the second oscillator signal to the second receiver circuit 312, it may be understood that circuit components of the first partial oscillator circuit and the second oscillator circuit may be used interchangeably for the generation of the first oscillator signal and/or the second oscillator signal as described with respect to FIG. 1.

The signals to be converted (e.g. the first radio frequency receive signal and the second radio frequency receive signal) may be amplified by the low-noise amplifier 313. The amplified signals to be converted may then be mixed with the LO signals using mixer 314. For example, the first oscillator signal may be mixed (e.g. using the mixer 314) with the first RF receive signal to be converted to produce a first baseband receive (output) signal for example. The second oscillator signal may be mixed (e.g. using the mixer 314) with the second RF receive signal to be converted to produce a second baseband receive (output) signal for example. The first RF receive signal and the second RF receive signal may include signal portions with one or more frequency bands (e.g. located between 500 MHz and 10 GHz), for example.

The down-converted output receive signal may be processed by filter 315, PGC 315, ADC 316 and DFE circuitry 318 to produce the (final) output baseband signal (e.g. having a frequency bandwidth located in the baseband domain of less than 100 MHz or less than 500 MHz).

The oscillator circuit (e.g. including PLL1 and PLL2), the control circuit, the first receiver circuit 311 and the second receiver circuit 312 may be formed on a common semiconductor die. For example, the two receiver circuits 311, 312 (and the oscillator circuit) may be placed on the same chip or silicon die.

Due to the first receiver circuit and the second receiver circuit being implemented on the same semiconductor chip, cross-talk interferences may occur between the circuit components. The dashed arrows represent various cross-talk coupling paths between DCO and LOs of one receiver into the building blocks of the other receiver. The two receivers, which may be used in LTE CA (carrier aggregation) may be placed on a common chip or silicon die. Placing two independent receiver on a common die may increase the level of integration and enable more CA band combinations, and therefore reduce the total cost of the system. However, there are several potential cross-talk coupling paths in such an integration, which could severely deteriorate the overall system performance. For example, cross-talk paths may occur from receiver #1 (the first receiver circuit 311) to receiver #2 (the second receiver circuit 312) and also in the opposite direction, e.g. from receiver #2 to receiver #1.

The cross-talk between adjacent blocks in the two receivers may be due to magnetic, capacitive or substrate coupling, which may both be significantly enhanced in densely integrated wireless transceivers. The magnetic coupling may be mainly determined by nearby inductors or metal structures. Substrate coupling may be mainly determined by the limited substrate isolation between adjacent blocks.

The different coupling paths may include (at least) two categories of cross-talk. The first category of cross-talk may relate to VCO/DCO-related cross-talk (or cross-talk generated by the controlled oscillator modules). For example, VCO/DCO to VCO/DCO cross-talk may occur from VCO/DCO of one receiver coupling into VCO/DCO of the other receiver (e.g. indicated by arrow c1) or the other way around. In another example, VCO/DCO to LO cross-talk may occur between a VCO/DCO from one receiver coupling into the LO distribution of the other receiver (e.g. indicated by arrow c2), or the other way around. In another example, VCO/DCO to LNA cross-talk may occur between a VCO/DCO from one receiver coupling into the LNA of the other receiver (e.g. indicated by arrow c3) (or the other way around). The control circuit may be configured to select the different oscillator circuit configurations to allow different controlled oscillator modules to be paired with the different frequency adjustment circuits to reduce or avoid the VCO/DCO related cross-talk.

The second category of cross-talk may relate to LO-distribution-related cross-talk. For example, LO to LO cross-talk may occur from LO distribution from one receiver coupling into the LO distribution of the other receiver (e.g. indicated by arrow c4). In another example, LO to LNA cross-talk may occur from LO distribution from one receiver coupling into the LNA of the other receiver (e.g. indicated by arrow c5). In another example, cross-talk may occur between LO and other blocks, such has from LO distribution from one receiver coupling into various building blocks in the other receiver lineup. The control circuit may be configured to select different oscillator configurations so as to provide adjustable power to different parts of the oscillator circuit, as described with respect to FIGS. 4 and 5 below.

The cross-talk in the oscillator circuits (e.g. whether the cross-talk is VCO/DCO related or LO-related) may be determined based on the cross-talk building law. The essential difference between the two main categories is the cross-talk building law that is involved. The building law itself may be evaluated with a general mathematical expression, which is a function of two LO frequencies and has partial or full form of (m×LO1±n×LO2), where LO1 is the LO frequency of the primary receiver, LO2 is the LO frequency of the secondary receiver, m and n are integer numbers representing either harmonic order or frequency division, as described above.

The cross-talk building law may be VCO/DCO related (e.g. related to the controlled oscillator module) if the coefficient multiplying the aggressor LO is equal to the frequency division between the aggressor VCO/DCO and the aggressor LO. (The aggressor LO may be the LO frequencies whose frequency harmonics are even integers, and the victim LO may be the LO frequencies whose frequency harmonics are odd integers according to the cross-talk building law, for example). In such cases, the VCO/DCO frequency may be directly involved in the cross-talk building law. On the other hand, if the above condition is not satisfied, then the building law maybe LO distribution related. A VCO/DCO related cross-talk building law always may include an LO distribution building law, i.e. both the VCO/DCO and the LO distributions may be an aggressor (for example, both integer m and n may be even harmonics).

A proof whether the building law is DCO-related or LO-related can be done experimentally, where the verification step may be helpful to fully characterize the behavior of the building law itself. In some examples, an aggressor or a victim may be determined based on experimental measurements by a measurement circuit configured to measure or identify cross-talk signal portions in the first oscillator signal and/or the second oscillator signal based on different oscillator circuit configurations.

For example, if the cross-talk building law is (3×LO1−2×LO2) and $f_{DCO2}=2\times LO2$, then this is may be a VCO/DCO related cross-talk building law for the primary receiver LO1. On the other hand, if the law is (3×LO1−2×LO2) and $f_{DCO2}=4\times LO2$, than this is an LO-related cross-talk building law for the primary receiver LO1.

Figure 4:
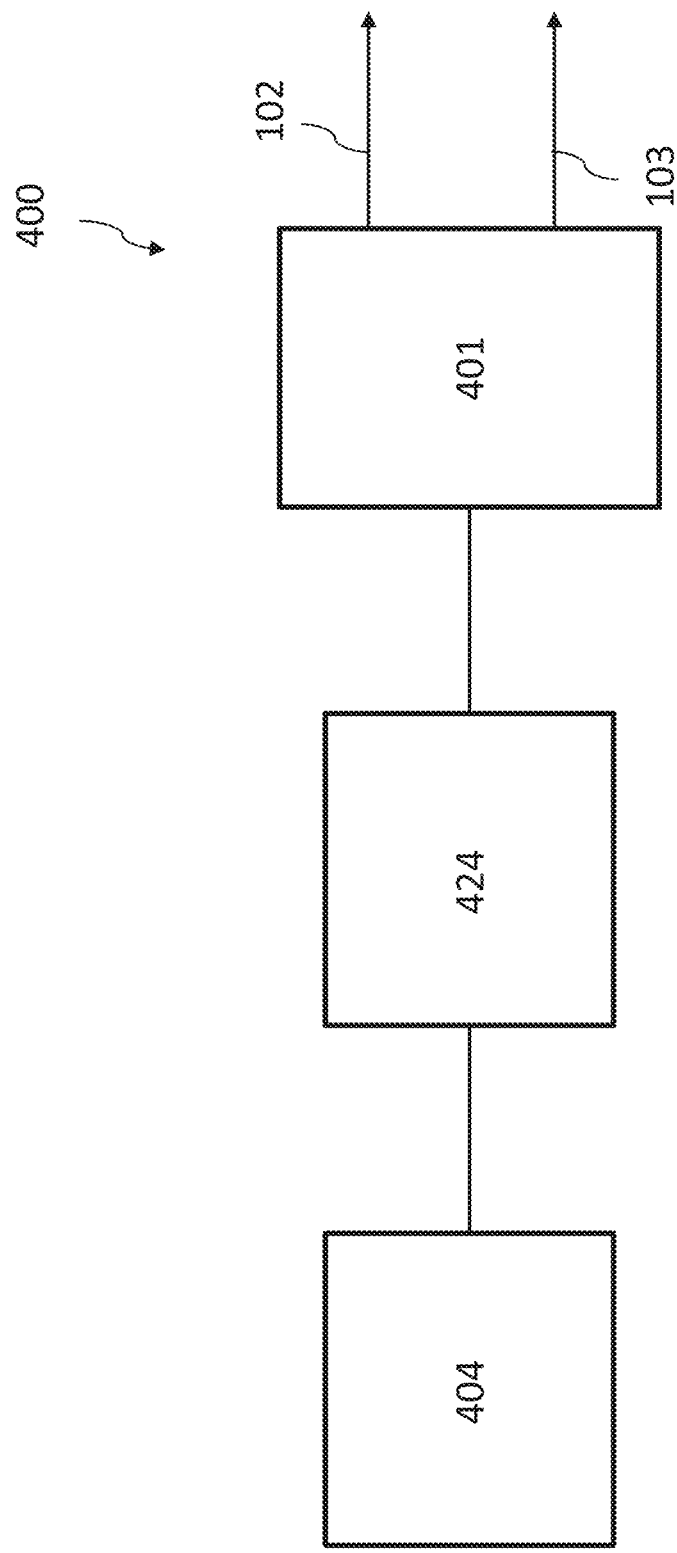
FIG. 4 shows a schematic illustration of an apparatus for providing oscillator signals with a variable power supply module.

While the VCO/DCO related cross-talk may be mitigated by adjusting the VCO/DCO frequency and the frequency adjustment circuit, the LO-related cross-talk may be mitigated by adjusting (e.g. reducing or increasing) the power supplied to parts of the oscillator circuit as described in FIG. 4.

More details and aspects are mentioned in connection with the examples described above or below (e.g. the apparatus for providing oscillator signals, the oscillator circuit, the control circuit, the first oscillator signal, the second oscillator signal, the oscillator circuit configurations, the receiver circuits, the controlled oscillator module, the frequency adjustment circuits, the memory module, the cross-talk building laws, and the cross-talk information). The examples shown in FIG. 3 may comprise one or more optional additional features corresponding to one or more aspects mentioned in connection with the proposed concept or one or more examples described above (e.g. FIG. 1 or 2) or below (e.g. FIGS. 4 to 11).

FIG. 4 shows a schematic illustration of an apparatus 400 for providing oscillator signals according to an example.

The apparatus 400 includes an oscillator circuit 401 configured to generate a first oscillator signal 102 with a first oscillator signal frequency for a frequency conversion of a first signal to be converted and to generate a second oscillator signal 103 with a second oscillator signal frequency for a frequency conversion of a second signal to be converted.

The apparatus 400 includes a variable power supply module 424 configured to supply at least one part of the oscillator circuit for providing the first oscillator signal or the second oscillator signal with adjustable power.

The apparatus 400 includes a control circuit 404 configured to control, based on the first oscillator signal frequency and the second oscillator signal frequency, a power supplied by the variable power supply module 424 to the at least one part of the oscillator circuit.

Due to the supply of adjustable power to at least one part of the oscillator circuit the unwanted cross-talk interferences may be reduced more effectively. For example, reduced power may be supplied to circuit components which are known to cause unwanted cross-talk interferences. This may lead to an improved performance of the apparatus and transmitter, transceiver or receiver module in which the apparatus is implemented, for example.

The apparatus 400 may be configured to provide or generate oscillator signals (e.g. local oscillator LO signals) for a transmitter, a receiver or a transceiver for transmitting signals (e.g. high frequency or radio frequency signals) or receiving signals (e.g. baseband signals), for example. The apparatus 400 may be implemented in a cell phone or a mobile device, for example. The apparatus 400 may be implemented on or may be a semiconductor chip or die including circuitry for providing or generating the oscillator signals, for example.

The oscillator circuit 401 of the apparatus 400 may be an oscillator circuit for generating local oscillator signals (LO) signals, for example. The oscillator circuit 401 may include circuit components (e.g. DCO and/or VCO, mixers, amplifiers and a plurality of frequency dividers) for generating the first oscillator signal 402 and the second oscillator signal 103, for example.

The control circuit 404 may be configured to control the power supplied by the variable power supply module 424 based on a cross-talk related information indicating that a cross-talk is related to the least one part of the oscillator circuit (e.g. if the cross-talk related information indicates that the cross-talk is LO-related).

The control circuit 104 may be configured to control the power supplied by the variable power supply module 424 based on predetermined oscillator circuit configurations stored in a look up table in a memory module. The control circuit 104 may be configured to search and/or select possible oscillator circuit configuration for adjusting the power supplied based on a cross-talk building law with the first oscillator signal frequency (e.g. LO1) and the second oscillator signal frequency (e.g. LO2) being input frequency parameter values.

A cross-talk building law (stored in the look up table) may indicate that a predetermined cross-talk condition based on the first oscillator signal frequency and the second oscillator signal frequency is present. The cross-talk building law may indicate that the cross-talk is related to least one part of the oscillator circuit (e.g. the cross-talk may be non-VCO/DCO related, but LO-distribution related) if a first frequency coefficient of the first oscillator signal frequency is not equal to a frequency division between a first controlled oscillator signal frequency and the first oscillator signal frequency and if a second frequency coefficient of the second oscillator signal frequency is not equal to a frequency division between a second controlled oscillator signal frequency and the second oscillator signal frequency.

In an example, the control circuit 404 may be configured to determination whether the cross-talk is LO-distribution related subsequent to determining whether the cross-talk is DCO/VCO related as described with respect to FIGS. 1 to 3. For example, after the control circuit 404 determines that the cross-talk is not DCO/VCO related, the control circuit 404 may provide at least one part of the oscillator circuit with adjustable power to reduce any LO-related cross-talk issues or interferences. In alternative examples the control circuit 404 may be configured to determination whether the cross-talk is LO-distribution related independently, before, or in conjunction with determining whether the cross-talk is DCO/VCO related as described with respect to FIGS. 1 to 3.

The control circuit 404 may identify an aggressor or a victim receiver circuit based on a cross-talk building law if a predetermined cross-talk building law related to the input first oscillator signal frequency and the input second oscillator signal frequency is stored in the look up tables. The aggressor receiver circuit injects unwanted disturbance into the victim receiver circuit and therefore degrades the performance of the victim receiver, for example.

The control circuit 404 may identify an aggressor receiver circuit as a receiver circuit to which the oscillator signal being supplied has an even integer frequency harmonic based on the cross-talk building law. The control circuit 404 may identify a victim receiver circuit as the receiver circuit to which the oscillator signal being supplied has an odd integer frequency harmonic based on the cross-talk building law. For example, if the cross-talk building law is (3×LO1−2×LO2), the parts of the receiver circuit receiving the second oscillator signal (e.g. LO2) or the partial oscillator circuit configuration supplying the second oscillator signal may be identified as the aggressor circuit.

In order to reduce LO-related cross-talk, the control circuit may be configured to control the power supplied so that the variable power supply module 424 applies lower voltages to aggressor circuits and to apply higher voltages to victim circuits, for example. For example, in the above example, the lower voltages may be supplied to the partial oscillator circuit configuration supplying the second oscillator signal.

The variable power supply module 424 may include one or more programmable voltage power supply controllers, e.g. a plurality of low-drop out regulators (LDO), e.g. $LDO_{11}$, $LDO_{12}$, $LDO_{13}$, $LDO_{14}$, which may be programmed to deliver (adjustable) LDO voltages and/or bias settings e.g. an adjustable voltage ($VDD_{11}$, $VDD_{12}$, $VDD_{13}$, $VDD_{14}$) or current signal to one or more oscillator circuit components, for example. The variable power supply module 424 may be coupled to the one or more oscillator circuit components, e.g. to a VCO/DCO, a frequency divider, or to the distribution circuit elements e.g. amplifiers.

The variable power supply module 424 may include a first plurality of programmable voltage power supply controllers, e.g. $LDO_{11}$, $LDO_{12}$, $LDO_{13}$, $LDO_{14}$, which may be programmed to deliver (adjustable) LDO voltages and/or bias settings e.g. an adjustable voltage ($VDD_{11}$, $VDD_{12}$, $VDD_{13}$, $VDD_{14}$) oscillator circuit components in the first partial oscillator circuit configuration, e.g. to the first controlled oscillator module 205, the first plurality of frequency adjustment circuits 207 and the first plurality of distribution elements 425a.

The variable power supply module 424 may include a second plurality of programmable voltage power supply controllers, e.g. $LDO_{21}$, $LDO_{22}$, $LDO_{23}$, $LDO_{24}$, which may be programmed to deliver (adjustable) LDO voltages and/or bias settings e.g. an adjustable voltage ($VDD_{21}$, $VDD_{22}$, $VDD_{23}$, $VDD_{24}$) oscillator circuit components in the second partial oscillator circuit configuration, e.g. to the second controlled oscillator module 206, the second plurality of frequency adjustment circuits 208 and the second plurality of distribution elements 425b.

The variable power supply module 424 may be configured to supply at least one oscillator component of the plurality of oscillator circuit components with adjustable power, for example. The variable power supply module 424 may be configured to supply increased or reduced power to at least one of the first and the second plurality of oscillator circuit components so that an amplitude of one of the first and the second oscillator signal is increased or reduced with respect to the other of the first and the second oscillator signal, for example.

The oscillator circuit 401 may additionally or optionally include one or more or all of the features of the oscillator circuit already described with respect to FIGS. 1 to 3. The control circuit 404 may additionally or optionally include one or more or all of the features of the control circuit already described with respect to FIGS. 1 to 3. Furthermore, the apparatus 400 may additionally or optionally include one or more or all of the features of the apparatus already described with respect to FIGS. 1 to 3.

More details and aspects are mentioned in connection with the examples described above or below (e.g. the apparatus for providing oscillator signals, the oscillator circuit, the control circuit, the first oscillator signal, the second oscillator signal, the oscillator circuit configurations, the receiver circuits, the controlled oscillator module, the frequency adjustment circuits, the memory module, the cross-talk building laws, and the cross-talk information). The examples shown in FIG. 4 may comprise one or more optional additional features corresponding to one or more aspects mentioned in connection with the proposed concept or one or more examples described above (e.g. FIGS. 1 to 3) or below (e.g. FIGS. 5 to 11).

Figure 5:
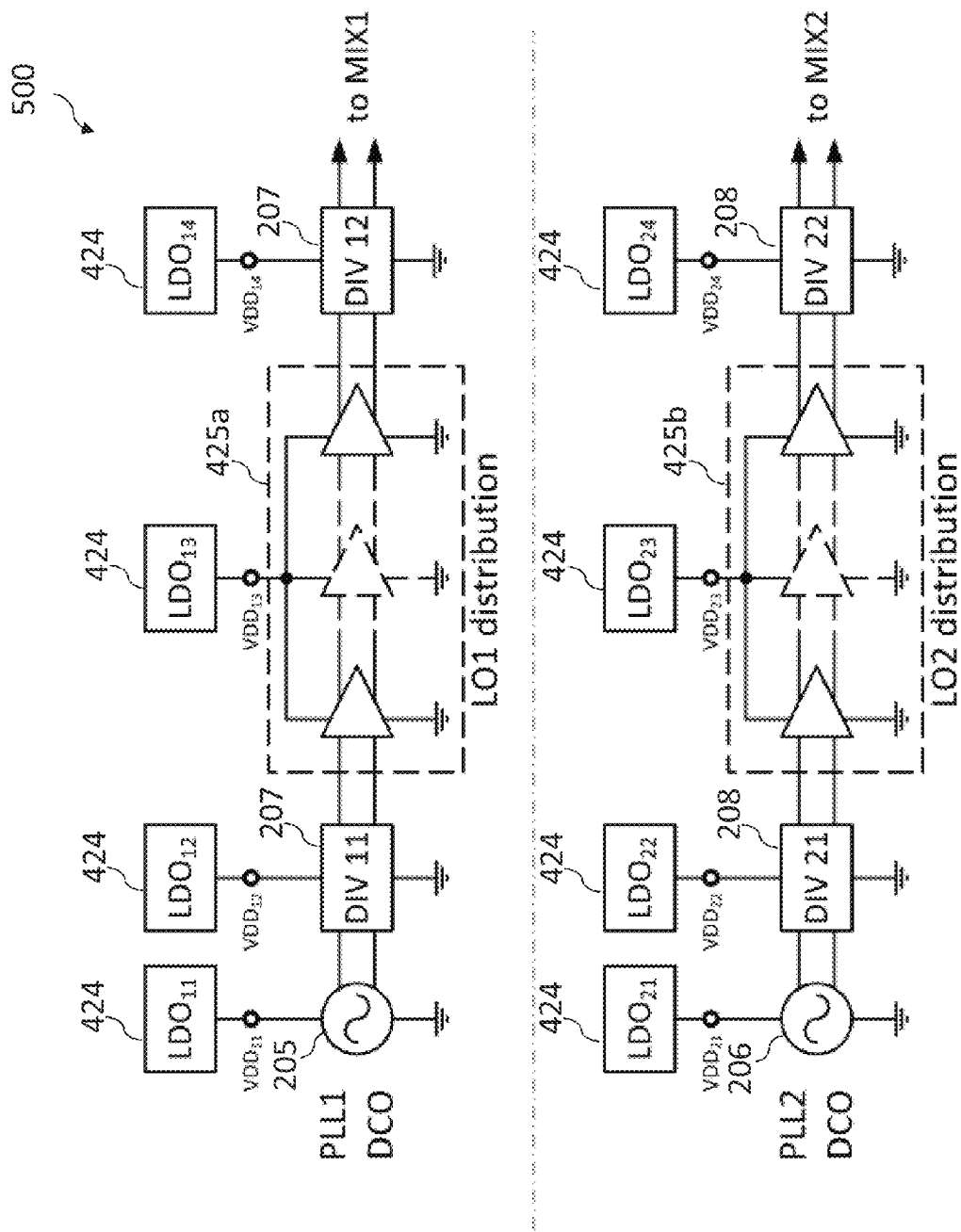
FIG. 5 shows a schematic illustration of an apparatus for providing oscillator signals with various variable power supply module implementations.

FIG. 5 shows an apparatus 500 for providing oscillator signals with a variable power supply module according to an example. The apparatus 500 may be similar to apparatus 400 (e.g. the apparatus 500 may additionally or optionally include one or more or all of the features already described with respect to apparatus 400).

Each variable power supply module 424 may include one or more programmable voltage power supply controllers, e.g. a plurality of low-drop out regulators (LDO). Dynamic spur optimization (DSO) may be realized with programmable LDO voltages and bias settings, for example. Each LDO 424 may be coupled to one or more oscillator circuit components, for example. In some cases, each a variable power supply module 424 may be coupled to each oscillator circuit component (e.g. to a VCO/DCO 205, 206, or a frequency divider 207, 208 such as e.g. DIV11 or DIV 12, or to distribution elements 425 such as amplifiers).

Dynamic Spur Optimization (DSO) with programmable LDO voltages and bias settings may be implemented to mitigate the LO-related cross-talk. The LO-related cross-talk may be considered as any cross-talk expressed partly or fully with (m×LO1±n×LO2), where m and n are arbitrary integer numbers. Since the LO1 and LO2 frequencies are fixed and requested by the wireless network, they cannot be generally changed unless LO1 and LO2 are a special case of DCO cross-talk (addressed in the DDS method earlier), there is no special frequency concept which can be applied to completely eliminate the cross-talk, for example.

Dynamic Spur Optimization exploits the exact knowledge of the LO1 and LO2 frequency and the exact knowledge of the cross-talk-building law behavior. In almost all cross-talk scenarios, one of the receivers acts as an aggressor, the other receiver acts as a victim, where the aggressor injects unwanted disturbance into the victim, and therefore degrading the performance of the victim receiver, for example. The amount of energy emitted into the environment (for aggressors) and the noise susceptibility of the system (for victims) strongly depend on the power supply and/or biasing of the involved blocks, for example. In general, a system powered up with the maximum supply voltage forces fast internal switching processes, which creates big disturbance signals in the surroundings, but it is immune to outside interferers, for example. On the other hand, a system powered up with the minimum supply voltage is characterized with slow switching processes, which reduces outside emissions but it is prone to interferers, for example.

The main principle of the DSO is to apply lower voltages to aggressor blocks, and to apply higher voltages to victim blocks, which corresponds to strengthening the victim blocks and quieting of the aggressor blocks, for example. The DSO utilizing a number of programmable Low-Drop Out regulators (LDOs) provides the supply of each block (of circuitry). FIG. 5 shows dedicated LDOs for each DCO, a dedicated LDO for each divider, and a dedicated LDO for the LO distribution itself. All those LDOs may be combined into one, or they may be programmed for different voltages without changing the DSO principle. Furthermore, the improved supply voltages do not necessarily need to be maximum or minimum, but their improved value could be determined and refined with measurement experiments, for example.

The programming principle is similar to the one used by the DDS, for example. The behavior of all cross-talk building laws are evaluated beforehand (analytically or experimentally), then the improved voltage settings are stored in the non-volatile memory of the transceiver, for example. During a power-up procedure, the transceiver firmware checks whether there is a building law based on the selected LO1 and LO2 frequency. If such law exists, the firmware will load the predefined improved voltage settings such that a LO-related cross-talk is reduced.

No additional hardware is required to implement the DSO. The improved DSO settings are flexible and they may be adapted after the hardware is fabricated. DSO provides an additional improvement of system cross-talk performance, and thus it mitigates the effect of LO-related cross-talk. The DSO does not necessarily exclude the DDS feature, and both techniques may be applied simultaneously.

More details and aspects are mentioned in connection with the examples described above or below (e.g. the apparatus for providing oscillator signals, the oscillator circuit, the control circuit, the first oscillator signal, the second oscillator signal, the oscillator circuit configurations, the receiver circuits, the variable power supply module, the controlled oscillator module, the frequency adjustment circuits, the first partial oscillator circuit and the second partial oscillator circuit, the memory module, the cross-talk building laws, and the cross-talk information). The examples shown in FIG. 5 may comprise one or more optional additional features corresponding to one or more aspects mentioned in connection with the proposed concept or one or more examples described above (e.g. FIGS. 1 to 4) or below (e.g. FIGS. 6 to 11).

Figure 6:
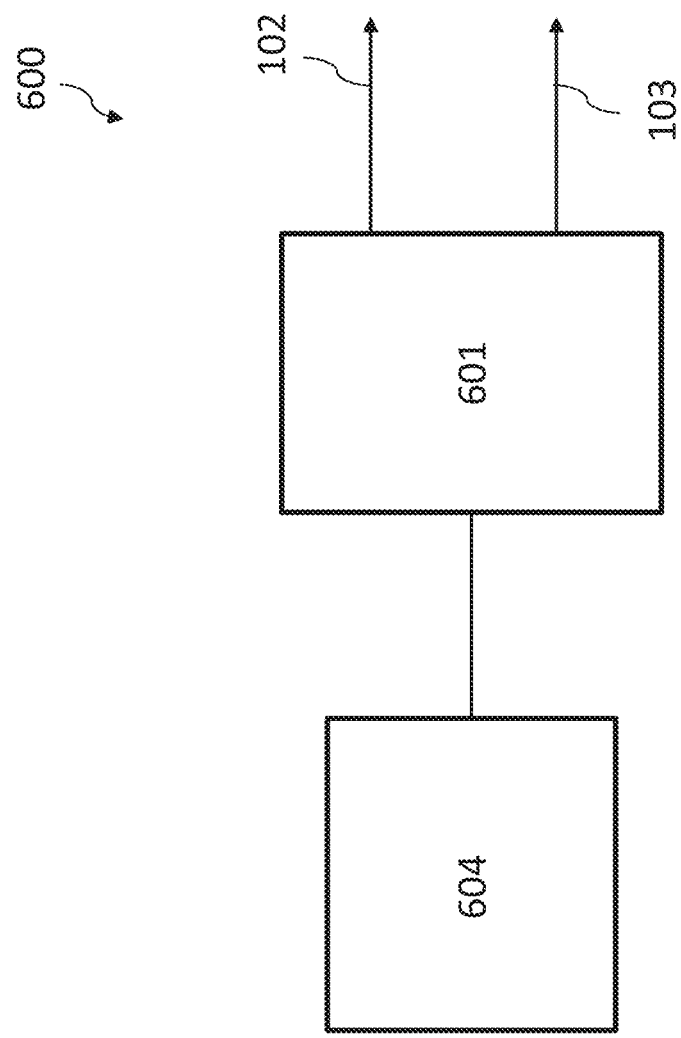
FIG. 6 shows a means for providing oscillator signals.

FIG. 6 shows a schematic illustration of means for providing oscillator signals 600 according to an example.

The means for providing oscillator signals 600 may be similar to the apparatuses described in FIGS. 1 to 5 (e.g. the means for providing oscillator signals 600 may additionally or optionally include one or more or all of the features of the apparatuses already described above).

The means for providing oscillator signals 600 includes means for generating oscillator signals 601 configured to generate a first oscillator signal 102 with a first oscillator signal frequency for a frequency conversion of a first signal to be converted and to generate a second oscillator signal 103 with a second oscillator signal frequency for a frequency conversion of a second signal to be converted.

The means for generating oscillator signals 601 is configured to enable the generation of the first oscillator signal 102 with the first oscillator signal frequency and the second oscillator signal 103 with the second oscillator signal frequency based on at least two different possible oscillator circuit configurations.

The means for providing oscillator signals 600 includes a control means for selecting oscillator circuit configurations 604 configured to select, based on the first oscillator signal frequency and the second oscillator signal frequency, one of the possible oscillator circuit configurations of the oscillator circuit for generating the first oscillator signal and the second oscillator signal.

Due to the generation of oscillator signals based on by different oscillator circuit configurations, cross-talk interferences may be reduced in the apparatus and/or in a transmitter and/or transceiver in which the apparatus is implemented.

For example, oscillator circuit configurations predicted to cause significant increase cross-talk interferences may be avoided, and improved oscillator circuit configurations may be used to generate the oscillator signals.

The means for generating oscillator signals 601 may include a first means for generating controlled oscillator signals and a second means for generating controlled oscillator signals. A first oscillator circuit configuration of the at least two different possible oscillator circuit configurations may use the first means for generating controlled oscillator signals for the generation of the first oscillator signal and a second oscillator circuit configuration of the at least two different possible oscillator circuit configurations may use the second means for generating controlled oscillator signals for the generation of the first oscillator signal.

The means for generating oscillator signals 601 may include a means for generating controlled oscillator signals configured to generate a controlled oscillator signal with adjustable oscillator signal frequency. A first oscillator circuit configuration of the at least two different possible oscillator circuit configuration may use the means for generating controlled oscillator signals 601 adjusted to generate the controlled oscillator signal with a first controlled oscillator signal frequency for the generation of the first oscillator signal. A second oscillator circuit configuration of the at least two different possible oscillator circuit configuration may use the means for generating controlled oscillator signals 601 adjusted to generate the controlled oscillator signal with a second controlled oscillator signal frequency for the generation of the first oscillator signal.

Each possible oscillator circuit configuration may be based on a first means for generating controlled oscillator signals coupled to at least one first means for frequency adjustment selected from a plurality of means for frequency adjustment for the generation of one of the first oscillator signal and the second oscillator signal and a second means for generating controlled oscillator signals coupled to at least one second means for frequency adjustment selected from the plurality of means for frequency adjustment for the generation of the other of the first oscillator signal and the second oscillator signal.

The control means for selecting oscillator circuit configurations 604 may be configured to select a possible oscillator circuit configuration based on a cross-talk related information indicating that a cross-talk is related to the means for generating controlled oscillator signals if a first frequency coefficient of the first oscillator signal frequency is equal to a frequency division between a first controlled oscillator signal frequency and the first oscillator signal frequency or if a second frequency coefficient of the second oscillator signal frequency is equal to a frequency division between a second controlled oscillator signal frequency and the second oscillator signal frequency.

More details and aspects are mentioned in connection with the examples described above or below (e.g. the apparatus for providing oscillator signals, the oscillator circuit, the control circuit, the first oscillator signal, the second oscillator signal, the oscillator circuit configurations, the receiver circuits, the controlled oscillator module, the frequency adjustment circuits, the memory module, the variable power supply module, the cross-talk building laws, and the cross-talk information). The examples shown in FIG. 6 may comprise one or more optional additional features corresponding to one or more aspects mentioned in connection with the proposed concept or one or more examples described above (e.g. FIGS. 1 to 5) or below (e.g. FIGS. 7 to 11).

Figure 7:
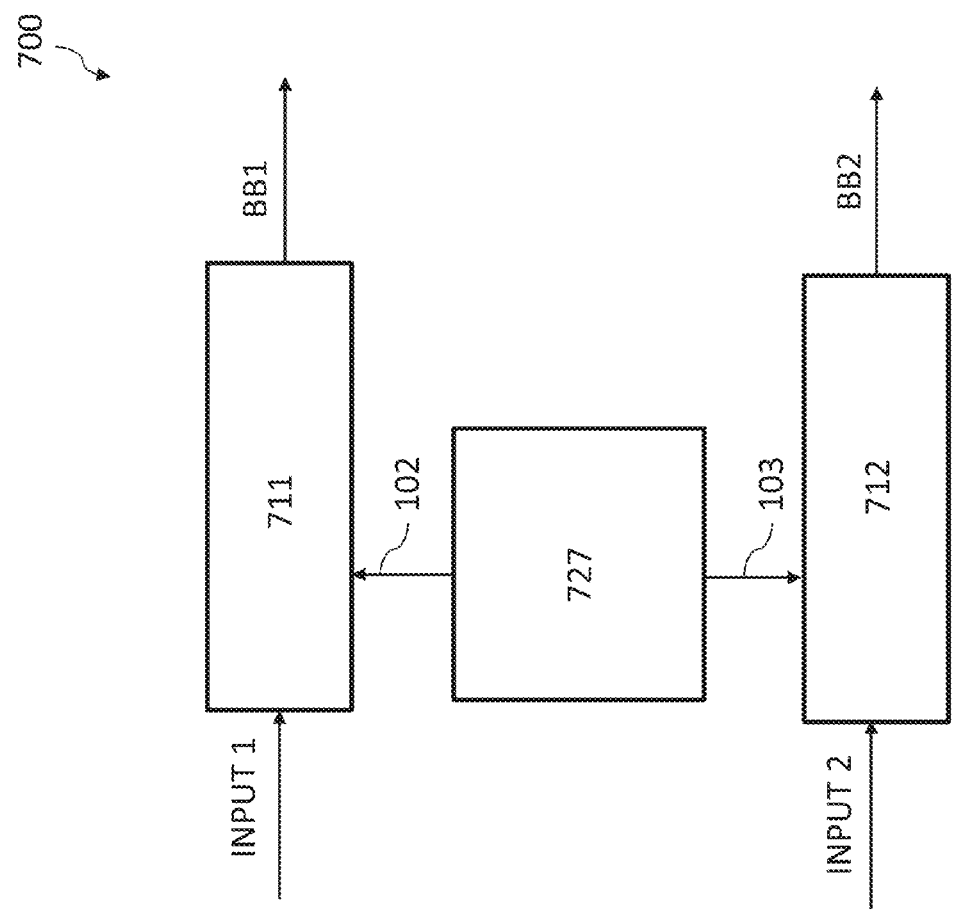
FIG. 7 shows a schematic illustration of a transceiver.

FIG. 7 shows a schematic illustration of a transceiver 700 according to an example.

The transceiver 700 includes a first receiver circuit 711 configured to generate a first baseband receive signal (e.g. BB1) based on the first radio frequency receive signal (e.g. input 1) and a first oscillator signal 102 with a first oscillator frequency.

The transceiver 700 further includes a second receiver circuit 712 configured to generate a second baseband receive signal (e.g. BB2) based on the second radio frequency RF receive signal (e.g. input 2) and a second oscillator signal 103 with a second oscillator frequency.

The transceiver 700 further includes an apparatus for providing oscillator signals 727 configured to generate the first oscillator signal 102 and the second oscillator signal 103. The apparatus 727 may be similar to the apparatuses described with respect to FIGS. 1 to 6, (e.g. the apparatus 727 may additionally or optionally include one or more all of the features already described with respect to FIGS. 1 to 6 for example).

The transceiver 700, including the apparatus for providing oscillator signals 727, the first receiver circuit 711 and the second receiver circuit 712, may be formed on a common semiconductor die, for example. The transceiver 700 may be part of a mobile device, for example.

More details and aspects are mentioned in connection with the examples described above or below (e.g. the apparatus for providing oscillator signals, the oscillator circuit, the control circuit, the receiver circuits, the first oscillator signal, the second oscillator signal, the oscillator circuit configurations, the controlled oscillator module, the frequency adjustment circuits, the memory module, the variable power supply module, the cross-talk building laws, and the cross-talk information). The examples shown in FIG. 7 may comprise one or more optional additional features corresponding to one or more aspects mentioned in connection with the proposed concept or one or more examples described above (e.g. FIGS. 1 to 6) or below (e.g. FIGS. 8 to 11).

Figure 8:
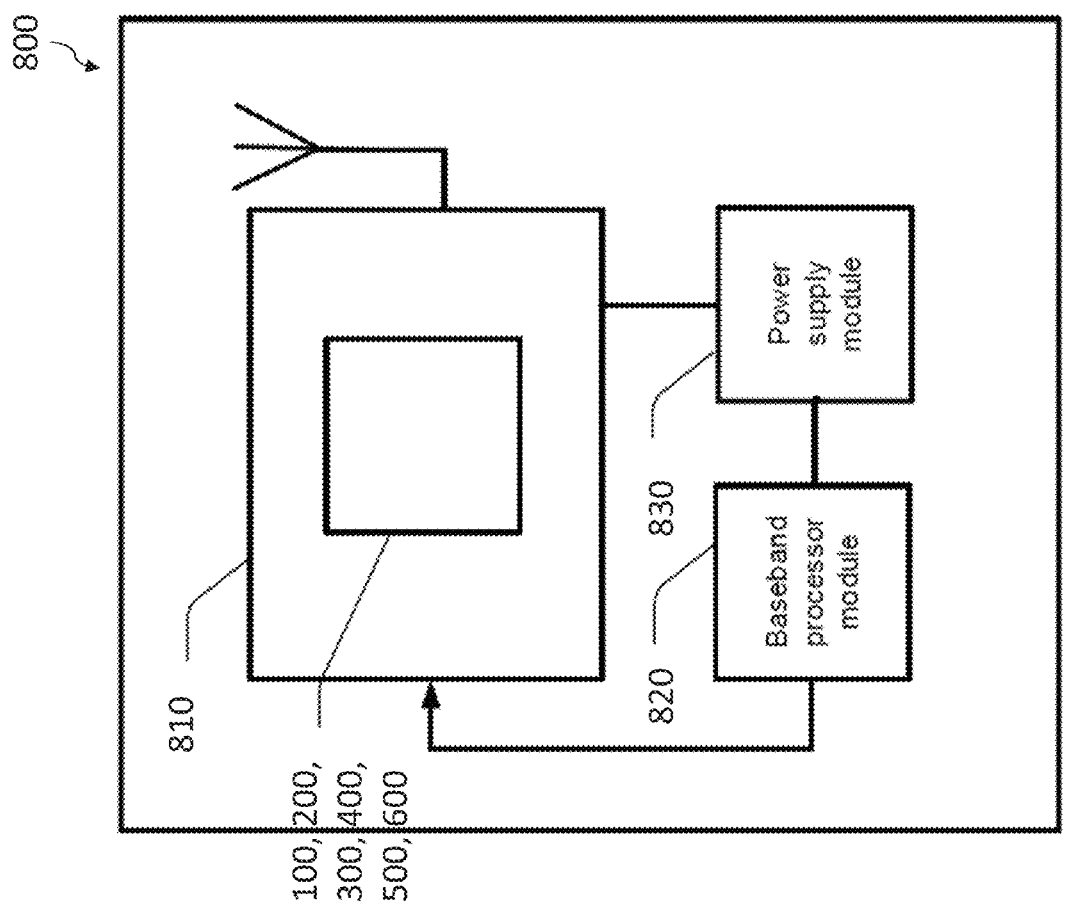
FIG. 8 shows a schematic illustration of a mobile device.

FIG. 8 shows a schematic illustration of a mobile device 800. The mobile device comprises an apparatus for providing oscillator signals (e.g. 100, 200, 300, 400, 500) or means for providing oscillator signals (e.g. 600) described in FIGS. 1 to 6, which is implemented in or within a transmitter or a transceiver 810. Further, the mobile device 800 comprises a baseband processor module 820 generating at least the digital (e.g. baseband) signal to be transmitted and/or processing a baseband receive signal. Additionally, the mobile device 800 comprises a power supply unit 830 supplying at least the transmitter or the transceiver 810 and the baseband processor module 820 with power.

In some examples, the power supply unit 830 may be integrated or implemented as at least part of the variable power supply module described in previous examples.

Further examples relate to a mobile device (e.g. a cell phone, a tablet or a laptop) including a transmitter or a transceiver described above. The mobile device or mobile terminal may be used for communicating in a mobile communication system. In some examples, a cell phone may include a transmitter or a transceiver comprising digital to analog converter circuit according to the proposed concept or one or more examples described above.

The apparatus for providing oscillator signals mitigates cross-talk in wireless transceivers which require simultaneous operation of two or more receivers and one or more transmitter. A typical example of simultaneous operation in wireless transceivers is found in LTE Carrier-Aggregation (CA) scenarios, where two independent receivers (including independent local oscillators) support reception of two different channels in either the same or two different LTE bands in order to increase data throughput, for example. A cross-talk between active blocks in the independent receivers, and especially in the LO distribution and DCOs, could severely deteriorate the system performance of the wireless transceiver, for example. The cross-talk becomes even more critical when the two or more transceivers are placed on a single silicon die. Therefore adaptive and flexible cross-talk mitigation techniques are needed to enable the increased system complexity and to allow the system to react appropriately on known interferers, for example. Various examples describe cross-talk mitigation techniques that may be used in wireless transceivers implemented on a single silicon die.

The cross-talk mitigation techniques are based on a precise knowledge of the LO frequencies used by the two receivers, the respective DCO frequencies, and precise knowledge of a cross-talk spur building law and its behavior. Furthermore, the LO frequency generation is designed in a way which allows a dedicated frequency to be realized by different DCOs in combination with respective frequency dividers. This flexible LO generation allows an improved selection of building blocks based on the selected LO frequency. Furthermore, the power supply of the DCOs and LO distribution is made programmable, which allows adapting the building blocks in an improved way from a cross-talk point of view. Various examples also avoid implementing transceivers in Carrier-Aggregation mode by placing two receivers in different chips or by combining the two separate chips on a printed-circuit-board (PCB) or as a System-in-Package (SiP).

More details and aspects are mentioned in connection with the examples described above or below (e.g. the apparatus for providing oscillator signals, the oscillator circuit, the control circuit, the receiver circuits, the first oscillator signal, the second oscillator signal, the oscillator circuit configurations, the controlled oscillator module, the frequency adjustment circuits, the memory module, the variable power supply module, the cross-talk building laws, and the cross-talk information). The examples shown in FIG. 8 may comprise one or more optional additional features corresponding to one or more aspects mentioned in connection with the proposed concept or one or more examples described above (e.g. FIGS. 1 to 7) or below (e.g. FIGS. 9 to 11).

Figure 9:
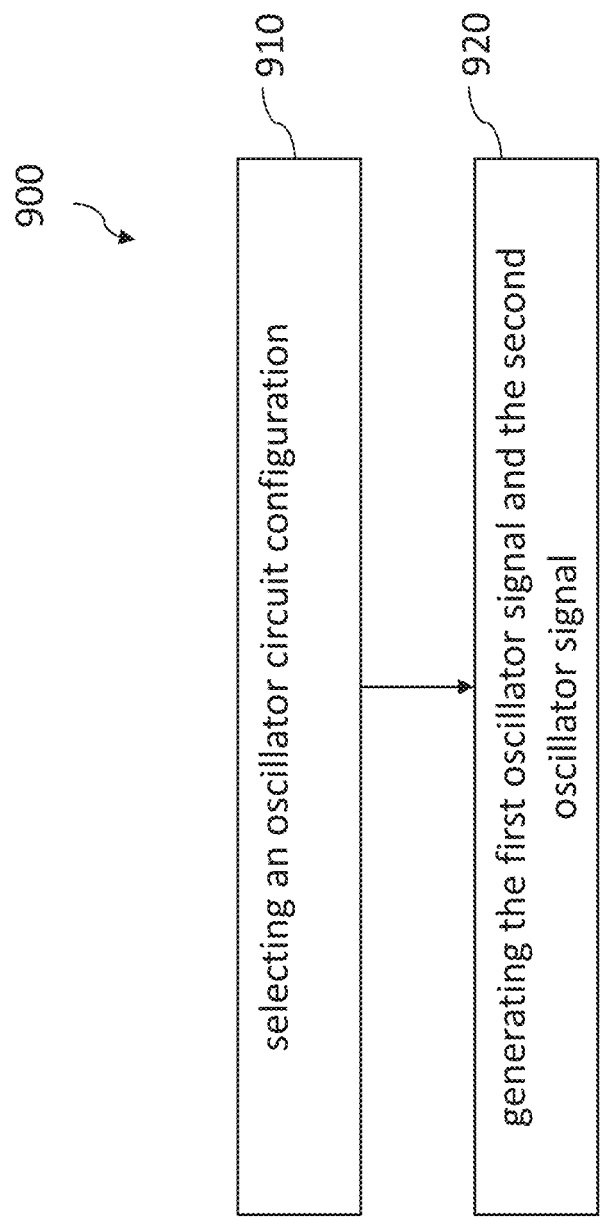
FIG. 9 shows a schematic illustration of a method for providing oscillator signals.

FIG. 9 shows a schematic illustration of a method 900 for providing oscillator signals according to an example.

The method 900 includes selecting 910, based on a first oscillator frequency of a first oscillator signal and a second oscillator frequency of a second oscillator signal, an oscillator circuit configuration of an oscillator circuit for generating the first oscillator signal and the second oscillator signal from at least two different possible oscillator circuit configurations.

The method 900 further includes generating 920 the first oscillator signal with the first oscillator frequency for a frequency conversion of a first signal to be converted and the second oscillator signal with the second oscillator frequency for a frequency conversion of a second signal to be converted based on the selected oscillator circuit configuration.

The flexible and adaptive selection of different possible oscillator circuit configurations may allow an improved selection of building blocks or circuit component so that known cross-talk interferences may be reduced, for example.

The method 900 may further include using a first controlled oscillator module for the generation of the first oscillator signal in a first oscillator circuit configuration of the at least two different possible oscillator circuit configuration. The method 900 may further include using a second controlled oscillator module for the generation of the first oscillator signal in a second oscillator circuit configuration of the at least two different possible oscillator circuit configuration.

The method 900 may further include using a controlled oscillator module adjusted to generate the controlled oscillator signal with a first controlled oscillator signal frequency for the generation of the first oscillator signal in a first oscillator circuit configuration of the at least two different possible oscillator circuit configurations. The method 900 may further include using the controlled oscillator module adjusted to generate the controlled oscillator signal with a second controlled oscillator signal frequency for the generation of the first oscillator signal in a second oscillator circuit configuration of the at least two different possible oscillator circuit configuration.

The method 900 may further include using a first frequency adjustment circuit for the generation of the first oscillator signal in a first oscillator circuit configuration of the at least two different possible oscillator circuit configurations. The method 900 may further include using a second frequency adjustment circuit for the generation of the first oscillator signal in a second oscillator circuit configuration of the at least two different possible oscillator circuit configuration.

The method 900 may further include selecting a possible oscillator circuit configuration based on a linear combination of the first oscillator signal frequency and the second oscillator signal frequency. The method 900 may further include selecting a possible oscillator circuit configuration if a linear combination of a product of a first frequency coefficient and a first oscillator signal frequency and a product of a second frequency coefficient and a second oscillator signal frequency falls below half of a baseband frequency bandwidth of an output baseband signal to be generated by the apparatus.

More details and aspects are mentioned in connection with the examples described above or below (e.g. the apparatus for providing oscillator signals, the oscillator circuit, the control circuit, the receiver circuits, the first oscillator signal, the second oscillator signal, the oscillator circuit configurations, the controlled oscillator module, the frequency adjustment circuits, the memory module, the variable power supply module, the cross-talk building laws, and the cross-talk information). The examples shown in FIG. 9 may comprise one or more optional additional features corresponding to one or more aspects mentioned in connection with the proposed concept or one or more examples described above (e.g. FIGS. 1 to 8) or below (e.g. FIGS. 10 to 11).

Figure 10:
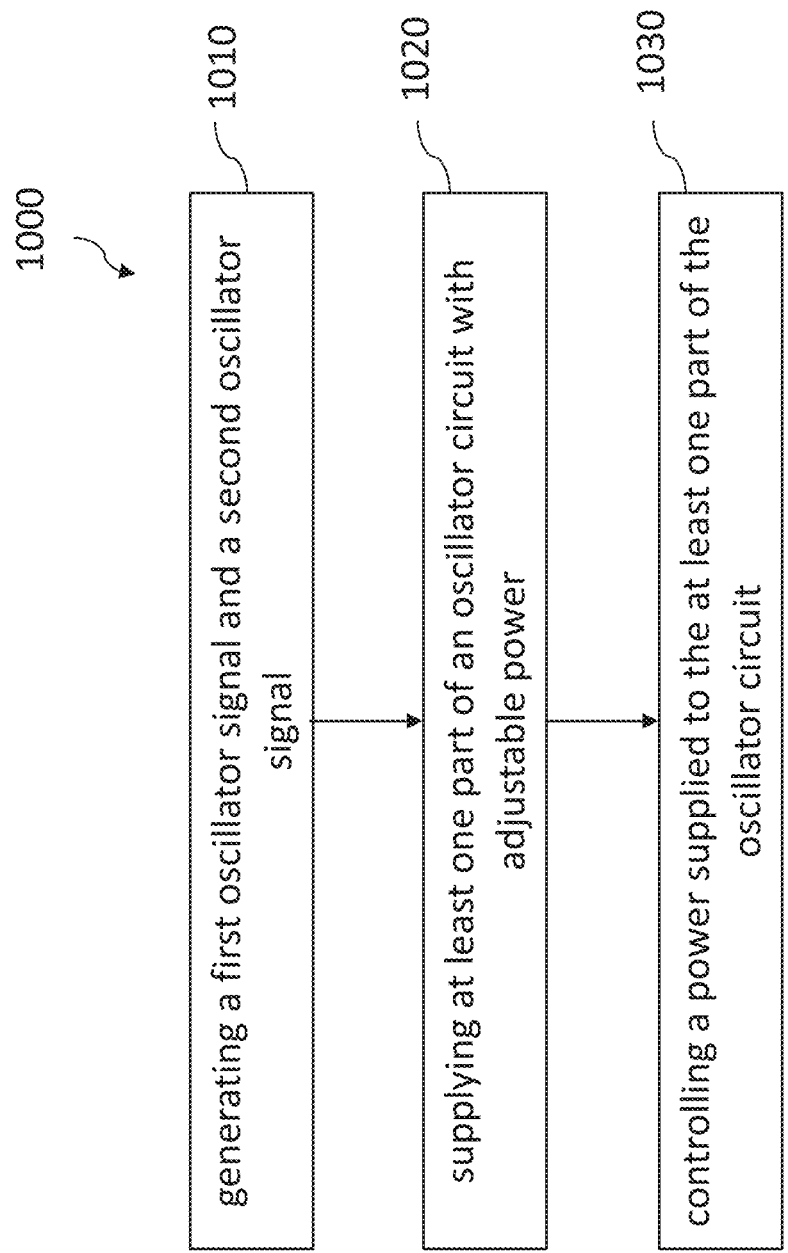
FIG. 10 shows a schematic illustration of a further method for providing oscillator signals including supplying adjustable power.

FIG. 10 shows a schematic illustration of a method 1000 for providing oscillator signals according to an example.

The method 1000 includes generating 1010 a first oscillator signal with a first oscillator signal frequency for a frequency conversion of a first signal to be converted and a second oscillator signal with a second oscillator signal frequency for a frequency conversion of a second signal to be converted.

The method 1000 further includes supplying 1020 at least one part of an oscillator circuit for providing the first oscillator signal or the second oscillator signal with adjustable power.

The method 1000 further includes controlling, based on the first oscillator signal frequency and the second oscillator signal frequency, a power supplied to the at least one part of the oscillator circuit.

The provision of adjustable power to parts of the oscillator circuit may allow some parts of the oscillator circuit to be supplied with increased power and some parts with reduce power. Therefore, unwanted interference from selected components may be reduced by reducing the power provided to those components. This may lead to a reduction in cross-talk, for example.

The method 1000 may further include selecting, based on the first oscillator signal frequency and the second oscillator signal frequency, a power supply configuration of the variable power supply module for supplying power to the at least one part of the oscillator circuit.

The method 1000 may further include controlling the power supplied to the at least one part of the oscillator circuit based on a cross-talk related information indicating that a cross-talk is related to the least one part of the oscillator circuit.

The cross-talk related information may indicate that the cross-talk is related to the least one part of the oscillator circuit module if a frequency division between a first controlled oscillator signal frequency and the first oscillator signal frequency has a value different to a first frequency coefficient of the first oscillator signal frequency and if a frequency division between a second controlled oscillator signal frequency and the second oscillator signal frequency has a value different to a second frequency coefficient of the second oscillator signal frequency.

The method 1000 may further include controlling the power supplied to a plurality of oscillator circuit components including a controlled oscillator module, at least one first frequency adjustment circuit and at least one distribution element for generating an oscillator signal.

The method 1000 may further include supplying increased or reduced power to at least one of the first and the second plurality of oscillator circuit components so that an amplitude of one of the first and the second oscillator signal is increased or reduced with respect to the other of the first and the second oscillator signal.

More details and aspects are mentioned in connection with the examples described above or below (e.g. the apparatus for providing oscillator signals, the oscillator circuit, the control circuit, the receiver circuits, the first oscillator signal, the second oscillator signal, the oscillator circuit configurations, the controlled oscillator module, the frequency adjustment circuits, the memory module, the variable power supply module, the cross-talk building laws, and the cross-talk information). The examples shown in FIG. 10 may comprise one or more optional additional features corresponding to one or more aspects mentioned in connection with the proposed concept or one or more examples described above (e.g. FIGS. 1 to 9) or below (e.g. FIG. 11).

Figure 11:
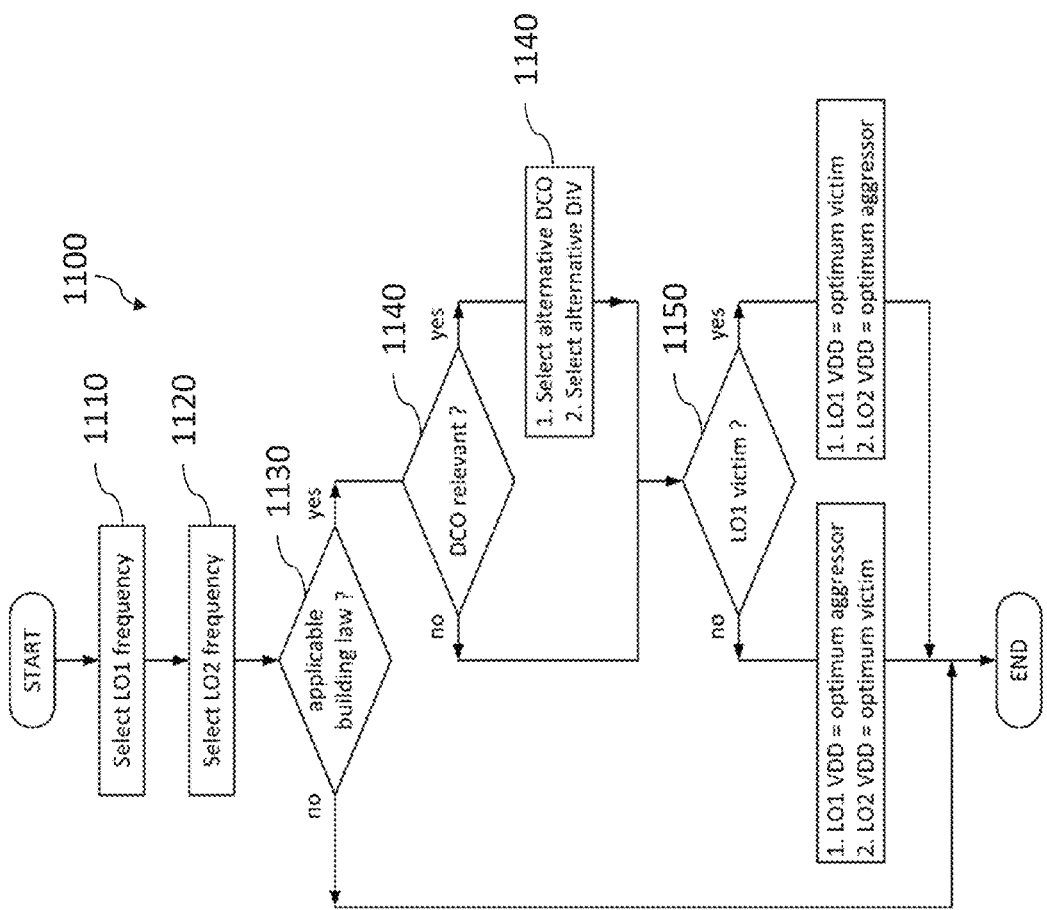
FIG. 11 shows a schematic illustration of a further method for providing oscillator signals for reducing different types of cross-talk.

FIG. 11 shows a schematic illustration of a method 1100 for providing oscillator signals according to an example.

The method 1100 may include selecting 1110 a first oscillator frequency (e.g. LO1) and selecting 1120 a second oscillator frequency (LO2), for example.

The method 1100 may include determining 1130 if an applicable building law is found in the memory module based on the first oscillator frequency (e.g. LO1) or a second oscillator frequency (LO2).

Subsequently, the method 1100 may include determining 1140 if the building law is DCO relevant. If the building law is DCO relevant, the method 1100 may include selecting 1150 a different oscillator circuit configuration (or DCO and frequency divider combination) to avoid DCO/VCO crosstalk related issues or intereferences (as described with respect to FIGS. 1 to 3).

Subsequently or additionally, if the building law is not DCO relevant the method 1100 may include determining 1150 which one of the frequency generator circuits is a victim or an aggressor, and supplying at least one part (e.g. the aggressor) of the oscillator circuit with adjustable power (as described with respect to FIGS. 4 and 5).

The method 1100 may include a general algorithm (or process) to apply the DDS and or DSO. The flowchart of the proposed algorithm may be implemented in cross-talk mitigation techniques, for example. The flowchart itself summarizes and combines the power up procedure for both DDS and DSO, for example. It assumes that all cross-talk building laws have been analyzed beforehand as a function of the LO1 and LO2 frequencies, and the corresponding improved settings are stored in non-volatile memory, for example. In the first phase, the algorithm checks from a database whether there is an applicable cross-talk building law with the desired LO1 and LO2 frequencies, for example. If an applicable cross-talk building law is found, the second phase of the algorithm checks from the database whether the law is DCO-relevant or not, for example. If the law is DCO-relevant, the algorithm selects the predefined alternative DCO and alternative divider, for example. The third phase of the algorithm determines from the database whether primary or secondary receiver is a victim, and it applies the corresponding pre-determined voltage settings, for example.

More details and aspects are mentioned in connection with the examples described above or below (e.g. the apparatus for providing oscillator signals, the oscillator circuit, the control circuit, the receiver circuits, the first oscillator signal, the second oscillator signal, the oscillator circuit configurations, the controlled oscillator module, the frequency adjustment circuits, the memory module, the variable power supply module, the cross-talk building laws, and the cross-talk information). The examples shown in FIG. 11 may comprise one or more optional additional features corresponding to one or more aspects mentioned in connection with the proposed concept or one or more examples described above (e.g. FIGS. 1 to 10) or below.

Various examples related to a machine readable storage medium including program code, when executed, to cause a machine to perform the method 900, 1000 or 1100.

Various examples related to a machine readable storage including machine readable instructions, when executed, to implement a method 900, 1000 or 1100 or realize an apparatus 100, 200, 300, 400, 500, or a means for providing oscillator signals 600.

Various examples related to a computer program having a program code for performing the method of 900, 1000 or 1100 when the computer is executed on a computer or processor.

Various examples relate to cross-talk-agile and cross-talk-adaptive LO generation and LO distribution concept for wireless transceivers. Various examples relate to LTE transceivers with carrier aggregation. Carrier aggregation may be two fold (two carriers) or multi-fold (multiple carriers). Various examples may be implemented in a transceiver, e.g. concurrent operation in WiFi in 2.4 GHz and 5 GHz bands. The various examples described may also be implemented in a mobile device configured to operate using one or more subscriber identity module (SIM) cards (e.g. in dual SIM devices, 2 SIM cards may be supported by a single phone).

The first oscillator signal and the second oscillator signal may be generated by the apparatus so that signals for the 2 SIM cards may be transmitted or received in parallel by a transmitter, receiver or transceiver in which the apparatus is implemented.

Various examples relate to adaptive biasing, carrier aggregation, cross-talk, cross-talk mitigation, dynamic DCO selection, LO distribution and LO generation.

There is a demand for providing an improved concept for providing oscillator signals, which may enable an improvement of the performance of transmitters and/or transceivers.

This demand may be satisfied by the subject matter of the claims.

In the following examples pertain to further examples. Example 1 is an apparatus for providing oscillator signals, comprising an oscillator circuit configured to generate a first oscillator signal with a first oscillator signal frequency for a frequency conversion of a first signal to be converted and to generate a second oscillator signal with a second oscillator signal frequency for a frequency conversion of a second signal to be converted, wherein the oscillator circuit is configured to enable the generation of the first oscillator signal with the first oscillator signal frequency and the second oscillator signal with the second oscillator signal frequency based on at least two different possible oscillator circuit configurations; and a control circuit configured to select, based on the first oscillator signal frequency and the second oscillator signal frequency, one of the possible oscillator circuit configurations of the oscillator circuit for generating the first oscillator signal and the second oscillator signal.

In example 2, the subject-matter of example 1 can optionally include the oscillator circuit comprising a first controlled oscillator module and a second controlled oscillator module, wherein a first oscillator circuit configuration of the at least two different possible oscillator circuit configuration uses the first controlled oscillator module for the generation of the first oscillator signal and a second oscillator circuit configuration of the at least two different possible oscillator circuit configuration uses the second controlled oscillator module for the generation of the first oscillator signal.

In example 3, the subject-matter of example 1 or 2 can optionally include the oscillator circuit comprising a controlled oscillator module configured to generate a controlled oscillator signal with adjustable oscillator signal frequency, wherein a first oscillator circuit configuration of the at least two different possible oscillator circuit configuration uses the controlled oscillator module adjusted to generate the controlled oscillator signal with a first controlled oscillator signal frequency for the generation of the first oscillator signal and a second oscillator circuit configuration of the at least two different possible oscillator circuit configurations uses the controlled oscillator module adjusted to generate the controlled oscillator signal with a second controlled oscillator signal frequency for the generation of the first oscillator signal.

In example 4, the subject-matter of example 2 or 3 can optionally include each controlled oscillator module of the oscillator circuit comprising a variable controlled oscillator or a digital controlled oscillator.

In example 5, the subject-matter of any of examples 1 to 4 can optionally include each possible oscillator circuit configuration being based on a first controlled oscillator module coupled to at least one first frequency adjustment circuit selected from a plurality of frequency adjustment circuits for the generation of one of the first oscillator signal and the second oscillator signal and a second controlled oscillator module coupled to at least one second frequency adjustment circuit selected from the plurality of frequency adjustment circuits for the generation of the other of the first oscillator signal and the second oscillator signal.

In example 6, the subject-matter of any of examples 1 to 5 can optionally include the oscillator circuit comprising a first frequency adjustment circuit and a second frequency adjustment circuit, wherein a first oscillator circuit configuration of the at least two different possible oscillator circuit configurations uses the first frequency adjustment circuit for the generation of the first oscillator signal and a second oscillator circuit configuration of the at least two different possible oscillator circuit configurations uses the second frequency adjustment circuit for the generation of the first oscillator signal.

In example 7, the subject-matter of example 5 or 6 can optionally include each frequency adjustment circuit comprising a frequency divider circuit for adjusting a frequency of a controlled oscillator signal generated by a controlled oscillator module.

In example 8, the subject-matter of any of examples 1 to 7 can optionally include the oscillator circuit being configured to generate one of the first oscillator signal and the second oscillator signal based on a first controlled oscillator signal generated by a first controlled oscillator module at a first controlled oscillator signal frequency and frequency adjusted by a first frequency adjustment factor associated with at least one first frequency adjustment circuit, and the other of the first oscillator signal and the second oscillator signal based on a second controlled oscillator signal generated by the second controlled oscillator module at a second controlled oscillator signal frequency and frequency adjusted by a second frequency adjustment factor associated with at least one second frequency adjustment circuit.

In example 9, the subject-matter of any of examples 5 to 8 can optionally include the first frequency adjustment circuit, the second frequency adjustment circuit, a first controlled oscillator signal frequency associated with the first controlled oscillator module and a second controlled oscillator signal frequency associated with the second controlled oscillator module being different in the at least two different possible oscillator circuit configurations.

In example 10, the subject-matter of any of examples 1 to 9 can optionally include each oscillator circuit configuration of the at least two oscillator circuit configurations comprising a first partial oscillator circuit configuration related to the generation of the first oscillator signal and a second partial oscillator circuit configuration related to the generation of the second oscillator signal.

In example 11, the subject-matter of any of examples 1 to 10 can optionally include the oscillator circuit comprising at least one multiplexer circuit configured to output at least one of the first oscillator signal and the second oscillator signal at an output terminal based on a selection of one of a plurality of multiplexer input signals provided by a plurality of frequency adjustment circuits.

In example 12, the subject-matter of any of examples 1 to 11 can optionally include the control circuit being configured to control a first controlled oscillator signal frequency of a first controlled oscillator signal generated by the first controlled oscillator module and a second controlled oscillator signal frequency of a second controlled oscillator signal generated by the second controlled oscillator module based on an oscillator circuit configuration selected by the control circuit.

In example 13, the subject-matter of any of examples 1 to 12 can optionally include the control circuit being configured to select the oscillator circuit configuration based on a cross-talk related information.

In example 14, the subject-matter of any of examples 1 to 13 can optionally include the control circuit being configured to select a default oscillator circuit configuration of the at least two oscillator circuit configurations if the cross-talk related information indicates that no predefined cross-talk condition is present.

In example 15, the subject-matter of any of examples 1 to 14 can optionally include the control circuit being configured to select a possible oscillator circuit configuration of the oscillator circuit from a plurality of predetermined possible oscillator circuit configurations stored in a memory module.

In example 16, the subject-matter of any of examples 1 to 15 can optionally include the control circuit being configured to select a possible oscillator circuit configuration based on a linear combination of the first oscillator signal frequency and the second oscillator signal frequency.

In example 17, the subject-matter of any of examples 1 to 16 can optionally include the control circuit being configured to select a possible oscillator circuit configuration based on a baseband frequency bandwidth of an output baseband signal to be generated by the apparatus.

In example 18, the subject-matter of any of examples 1 to 17 can optionally include the control circuit being configured to select a possible oscillator circuit configuration if a linear combination of a product of a first frequency coefficient and a first oscillator signal frequency and a product of a second frequency coefficient and a second oscillator signal frequency falls below half of a baseband frequency bandwidth of an output baseband signal to be generated by the apparatus.

In example 19, the subject-matter of any examples 2 to 18 can optionally include the control circuit being configured to select a possible oscillator circuit configuration based on a cross-talk related information indicating that a cross-talk is related to at least one of the first controlled oscillator module and the second controlled oscillator module if a first frequency coefficient of the first oscillator signal frequency is equal to a frequency division between a first controlled oscillator signal frequency and the first oscillator signal frequency or if a second frequency coefficient of the second oscillator signal frequency is equal to a frequency division between a second controlled oscillator signal frequency and the second oscillator signal frequency.

In example 20, the subject-matter of any of examples 1 to 18 can optionally include the apparatus comprising a first receiver circuit configured to generate a first baseband receive signal based on a first radio frequency receive signal and the first oscillator signal with the first oscillator frequency; and a second receiver circuit configured to generate a second baseband receive signal based on a second radio frequency receive signal and the second oscillator signal having the second oscillator frequency.

In example 21, the subject-matter of example 20 can optionally include the oscillator circuit, the control circuit, the first receiver circuit and the second receiver circuit being formed on a common semiconductor die.

In example 22, the subject-matter of any of examples 10 to 21 can optionally include the control circuit being configured to select a first oscillator circuit configuration for the generation of the first oscillator signal with the first oscillator signal frequency being a first frequency and the second oscillator signal with the second oscillator signal frequency being a second frequency, wherein the control circuit is configured to select a second oscillator circuit configuration for the generation of the first oscillator signal with the first oscillator signal frequency being the first frequency and the second oscillator signal with the second oscillator signal frequency being a third frequency, wherein the second frequency and the third frequency are different, wherein the first oscillator circuit configuration comprises the first partial oscillator circuit configuration different from the first partial oscillator circuit configuration of the second oscillator circuit configuration.

In example 23, the subject-matter of any of examples 1 to 21 can optionally include the plurality of possible oscillator circuit configurations comprising a default oscillator circuit configuration for the generation of the first oscillator signal with the first oscillator frequency and the second oscillator signal with the second oscillator frequency, and at least one cross-talk related oscillator circuit configuration for the generation of the first oscillator signal with the first oscillator frequency and the second oscillator signal with the second oscillator frequency if a predefined cross-talk criteria is fulfilled.

Example 24 is an apparatus for providing oscillator signals, comprising an oscillator circuit configured to generate a first oscillator signal with a first oscillator signal frequency for a frequency conversion of a first signal to be converted and to generate a second oscillator signal with a second oscillator signal frequency for a frequency conversion of a second signal to be converted; a variable power supply module configured to supply at least one part of the oscillator circuit for providing the first oscillator signal or the second oscillator signal with adjustable power; and a control circuit configured to control, based on the first oscillator signal frequency and the second oscillator signal frequency, a power supplied by the variable power supply module to the at least one part of the oscillator circuit.

In example 25, the subject-matter of example 24 can optionally include the control circuit being configured to control the power supplied by the variable power supply module based on a cross-talk related information indicating that a cross-talk is related to the least one part of the oscillator circuit.

In example 26, the subject-matter of example 24 or 25 can optionally include the cross-talk related information indicating that the cross-talk is related to the least one part of the oscillator circuit if a first frequency coefficient of the first oscillator signal frequency is not equal to a frequency division between a first controlled oscillator signal frequency and the first oscillator signal frequency and if a second frequency coefficient of the second oscillator signal frequency is not equal to a frequency division between a second controlled oscillator signal frequency and the second oscillator signal frequency.

In example 27, the subject-matter of any of examples 24 to 26 can optionally include the oscillator circuit comprising a plurality of oscillator circuit components comprising at least one of a controlled oscillator module, a first frequency adjustment circuit and a distribution element for generating an oscillator signal, wherein the variable power supply module is configured to supply at least one oscillator component of the plurality of oscillator circuit components with adjustable power.

In example 28, the subject-matter of any of examples 24 to 27 can optionally include the apparatus including a first plurality of oscillator circuit components for generating the first oscillator signal with the first oscillator signal frequency, and a second plurality of oscillator circuit components for generating the second oscillator signal with the second oscillator signal frequency, wherein the variable power supply module is configured to supply increased or reduced power to at least one of the first plurality of oscillator circuit components and the second plurality of oscillator circuit components so that an amplitude of one of the first oscillator signal and the second oscillator signal is increased or reduced with respect to the other of the first and the second oscillator signal.

Example 29 is a means for providing oscillator signals, comprising a means for generating oscillator signals configured to generate a first oscillator signal with a first oscillator signal frequency for a frequency conversion of a first signal to be converted and to generate a second oscillator signal with a second oscillator signal frequency for a frequency conversion of a second signal to be converted, wherein the means for generating oscillator signals is configured to enable the generation of the first oscillator signal with the first oscillator signal frequency and the second oscillator signal with the second oscillator signal frequency based on at least two different possible oscillator circuit configurations; and a control means for selecting oscillator circuit configurations configured to select, based on the first oscillator signal frequency and the second oscillator signal frequency, one of the possible oscillator circuit configurations of the oscillator circuit for generating the first oscillator signal and the second oscillator signal.

In example 30, the subject-matter of example 29 can optionally include the means for generating oscillator signals comprising a first means for generating controlled oscillator signals and a second means for generating controlled oscillator signals, wherein a first oscillator circuit configuration of the at least two different possible oscillator circuit configurations uses the first means for generating controlled oscillator signals for the generation of the first oscillator signal and a second oscillator circuit configuration of the at least two different possible oscillator circuit configurations uses the second means for generating controlled oscillator signals for the generation of the first oscillator signal.

In example 31, the subject-matter of example 29 or 30 can optionally include the means for generating oscillator signals comprising a means for generating controlled oscillator signals configured to generate a controlled oscillator signal with adjustable oscillator signal frequency, wherein a first oscillator circuit configuration of the at least two different possible oscillator circuit configurations uses the means for generating controlled oscillator signals adjusted to generate the controlled oscillator signal with a first controlled oscillator signal frequency for the generation of the first oscillator signal and a second oscillator circuit configuration of the at least two different possible oscillator circuit configurations uses the means for generating controlled oscillator signals adjusted to generate the controlled oscillator signal with a second controlled oscillator signal frequency for the generation of the first oscillator signal.

In example 32, the subject-matter of example 29 or 31 can optionally include each possible oscillator circuit configuration being based on a first means for generating controlled oscillator signals coupled to at least one first means for frequency adjustment selected from a plurality of means for frequency adjustment for the generation of one of the first oscillator signal and the second oscillator signal and a second means for generating controlled oscillator signals coupled to at least one second means for frequency adjustment selected from the plurality of means for frequency adjustment for the generation of the other of the first oscillator signal and the second oscillator signal.

In example 33, the subject-matter of any of examples 29 to 32 can optionally include the means for generating oscillator signals being configured to select a possible oscillator circuit configuration based on a cross-talk related information indicating that a cross-talk is related to the means for generating controlled oscillator signals if a first frequency coefficient of the first oscillator signal frequency is equal to a frequency division between a first controlled oscillator signal frequency and the first oscillator signal frequency or if a second frequency coefficient of the second oscillator signal frequency is equal to a frequency division between a second controlled oscillator signal frequency and the second oscillator signal frequency.

Example 34 is a transceiver, comprising a first receiver circuit configured to generate a first baseband receive signal based on a first radio frequency receive signal and a first oscillator signal with a first oscillator frequency; a second receiver circuit configured to generate a second baseband receive signal based on a second radio frequency receive signal and a second oscillator signal with a second oscillator frequency; and an apparatus for providing oscillator signals according to any of the previous examples configured to generate the first oscillator signal and the second oscillator signal.

Example 35 is a transmitter, a receiver or a transceiver comprising an apparatus for providing oscillator signals according to any of examples 1 to 33.

Example 36 is a mobile device comprising a transmitter, a receiver or a transceiver according to example 34 or 35.

Example 37 is a cell phone comprising a transmitter, a receiver or a transceiver according to example 34 or 35.

Example 38 is a method for providing oscillator signals, the method comprising selecting, based on a first oscillator frequency of a first oscillator signal and a second oscillator frequency of a second oscillator signal, an oscillator circuit configuration of an oscillator circuit for generating the first oscillator signal and the second oscillator signal from at least two different possible oscillator circuit configurations; and generating the first oscillator signal with the first oscillator frequency for a frequency conversion of a first signal to be converted and the second oscillator signal with the second oscillator frequency for a frequency conversion of a second signal to be converted based on the selected oscillator circuit configuration.

In example 39, the subject-matter of example 38 can optionally include using a first controlled oscillator module for the generation of the first oscillator signal in a first oscillator circuit configuration of the at least two different possible oscillator circuit configurations; and using a second controlled oscillator module for the generation of the first oscillator signal in a second oscillator circuit configuration of the at least two different possible oscillator circuit configurations.

In example 40, the subject-matter of example 38 or 39 can optionally include using a controlled oscillator module adjusted to generate the controlled oscillator signal with a first controlled oscillator signal frequency for the generation of the first oscillator signal in a first oscillator circuit configuration of the at least two different possible oscillator circuit configurations; and using the controlled oscillator module adjusted to generate the controlled oscillator signal with a second controlled oscillator signal frequency for the generation of the first oscillator signal in a second oscillator circuit configuration of the at least two different possible oscillator circuit configurations.

In example 41, the subject-matter of any of examples 38 to 40 can optionally include using a first frequency adjustment circuit for the generation of the first oscillator signal in a first oscillator circuit configuration of the at least two different possible oscillator circuit configurations; and using a second frequency adjustment circuit for the generation of the first oscillator signal in a second oscillator circuit configuration of the at least two different possible oscillator circuit configurations.

In example 42, the subject-matter of any of examples 38 to 41 can optionally include selecting a possible oscillator circuit configuration based on a linear combination of the first oscillator signal frequency and the second oscillator signal frequency.

In example 43, the subject-matter of any of examples 38 to 42 can optionally include selecting a possible oscillator circuit configuration if a linear combination of a product of a first frequency coefficient and a first oscillator signal frequency and a product of a second frequency coefficient and a second oscillator signal frequency falls below half of a baseband frequency bandwidth of an output baseband signal to be generated by the apparatus.

Example 44 is a method for providing oscillator signals, the method comprising generating a first oscillator signal with a first oscillator signal frequency for a frequency conversion of a first signal to be converted and a second oscillator signal frequency for a frequency conversion of a second signal to be converted; supplying at least one part of an oscillator circuit for providing the first oscillator signal or the second oscillator signal with adjustable power; and controlling, based on the first oscillator signal frequency and the second oscillator signal frequency, a power supplied to the at least one part of the oscillator circuit.

In example 45, the subject-matter of example 44 can optionally include selecting, based on the first oscillator signal frequency and the second oscillator signal frequency, a power supply configuration of the variable power supply module for supplying power to the at least one part of the oscillator circuit.

In example 46, the subject-matter of example 44 or 45 can optionally include controlling the power supplied to the at least one part of the oscillator circuit based on a cross-talk related information indicating that a cross-talk is related to the least one part of the oscillator circuit.

In example 47, the subject-matter of any of examples 44 to 46 can optionally include the cross-talk related information indicating that the cross-talk is related to the least one part of the oscillator circuit module if a frequency division between a first controlled oscillator signal frequency and the first oscillator signal frequency has a value different to a first frequency coefficient of the first oscillator signal frequency and if a frequency division between a second controlled oscillator signal frequency and the second oscillator signal frequency has a value different to a second frequency coefficient of the second oscillator signal frequency.

In example 48, the subject-matter of any of examples 44 to 47 can optionally include controlling the power supplied to the at least one part of the oscillator circuit comprising controlling the power supplied to a plurality of oscillator circuit components comprising a controlled oscillator module, at least one first frequency adjustment circuit and at least one distribution element for generating an oscillator signal.

In example 49, the subject-matter of any of examples 44 to 48 can optionally include controlling the power supplied to the at least one part of the oscillator circuit comprising supplying increased or reduced power to at least one of the first and the second plurality of oscillator circuit components so that an amplitude of one of the first and the second oscillator signal is increased or reduced with respect to the other of the first and the second oscillator signal.

Example 50 is a machine readable storage medium including program code, when executed, to cause a machine to perform the method of one of the examples 38 to 49.

Example 51 is a machine readable storage including machine readable instructions, when executed, to implement a method or realize an apparatus as claimed in any previous example.

Example 52 is a computer program having a program code for performing the method of any of the examples 38 to 49 when the computer is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

The invention claimed is:

1. An apparatus for providing oscillator signals, comprising:
    an oscillator circuit configured to generate a first oscillator signal with a first oscillator signal frequency for a frequency conversion of a first signal to be converted and to generate a second oscillator signal with a second oscillator signal frequency for a frequency conversion of a second signal to be converted,
    wherein the oscillator circuit is configured to enable the generation of the first oscillator signal with the first oscillator signal frequency and the second oscillator signal with the second oscillator signal frequency based on at least two different possible oscillator circuit configurations; and
    a control circuit configured to select, based on the first oscillator signal frequency and the second oscillator signal frequency, one of the possible oscillator circuit configurations of the oscillator circuit for generating the first oscillator signal and the second oscillator signal,
    wherein the control circuit is configured to select a possible oscillator circuit configuration of the oscillator circuit from a plurality of predetermined possible oscillator circuit configurations stored in a memory module.

2. The apparatus according to claim 1, wherein the oscillator circuit comprises a first controlled oscillator module and a second controlled oscillator module, wherein a first oscillator circuit configuration of the at least two different possible oscillator circuit configurations uses the first controlled oscillator module for the generation of the first oscillator signal and a second oscillator circuit configuration of the at least two different possible oscillator circuit configurations uses the second controlled oscillator module for the generation of the first oscillator signal.

3. The apparatus according to claim 1, wherein the oscillator circuit comprises a controlled oscillator module configured to generate a controlled oscillator signal with adjustable oscillator signal frequency, wherein a first oscillator circuit configuration of the at least two different possible oscillator circuit configurations uses the controlled oscillator module adjusted to generate the controlled oscillator signal with a first controlled oscillator signal frequency for the generation of the first oscillator signal and a second oscillator circuit configuration of the at least two different possible oscillator circuit configurations uses the controlled oscillator module adjusted to generate the controlled oscillator signal with a second controlled oscillator signal frequency for the generation of the first oscillator signal.

4. The apparatus according to claim 2, wherein each controlled oscillator module of the oscillator circuit comprises a variable controlled oscillator or a digital controlled oscillator.

5. The apparatus according to claim 1, wherein each possible oscillator circuit configuration is based on a first controlled oscillator module coupled to at least one first frequency adjustment circuit selected from a plurality of frequency adjustment circuits for the generation of one of the first oscillator signal and the second oscillator signal and a second controlled oscillator module coupled to at least one second frequency adjustment circuit selected from the plurality of frequency adjustment circuits for the generation of the other of the first oscillator signal and the second oscillator signal.

6. The apparatus according to claim 1, wherein the oscillator circuit comprises a first frequency adjustment circuit and a second frequency adjustment circuit, wherein a first oscillator circuit configuration of the at least two different possible oscillator circuit configurations uses the first frequency adjustment circuit for the generation of the first oscillator signal and a second oscillator circuit configuration of the at least two different possible oscillator circuit configurations uses the second frequency adjustment circuit for the generation of the first oscillator signal.

7. The apparatus according to claim 5, wherein each frequency adjustment circuit comprises a frequency divider circuit for adjusting a frequency of a controlled oscillator signal generated by a controlled oscillator module.

8. The apparatus according to claim 1, wherein the oscillator circuit is configured to generate one of the first oscillator signal and the second oscillator signal based on a first controlled oscillator signal generated by a first controlled oscillator module at a first controlled oscillator signal frequency and frequency adjusted by a first frequency adjustment factor associated with at least one first frequency adjustment circuit, and the other of the first oscillator signal and the second oscillator signal based on a second controlled oscillator signal generated by the second controlled oscillator module at a second controlled oscillator signal frequency and frequency adjusted by a second frequency adjustment factor associated with at least one second frequency adjustment circuit.

9. The apparatus according to claim 5, wherein at least one of the first frequency adjustment circuit, the second frequency adjustment circuit, a first controlled oscillator signal frequency associated with the first controlled oscillator module and a second controlled oscillator signal frequency associated with the second controlled oscillator module is different in the at least two different possible oscillator circuit configurations.

10. The apparatus according to claim 1, wherein each oscillator circuit configuration of the at least two oscillator circuit configurations comprises a first partial oscillator circuit configuration related to the generation of the first oscillator signal and a second partial oscillator circuit configuration related to the generation of the second oscillator signal.

11. The apparatus according to claim 1, wherein the oscillator circuit comprises at least one multiplexer circuit configured to output at least one of the first oscillator signal and the second oscillator signal at an output terminal based on a selection of one of a plurality of multiplexer input signals provided by a plurality of frequency adjustment circuits.

12. The apparatus according to claim 1, wherein the control circuit is configured to control a first controlled oscillator signal frequency of a first controlled oscillator signal generated by the first controlled oscillator module and a second controlled oscillator signal frequency of a second controlled oscillator signal generated by the second controlled oscillator module based on an oscillator circuit configuration selected by the control circuit.

13. The apparatus according to claim 1, wherein the control circuit is configured to select the oscillator circuit configuration based on a cross-talk related information.

14. The apparatus according to claim 1, wherein the control circuit is configured to select a default oscillator circuit configuration of the at least two oscillator circuit configurations if the cross-talk related information indicates that no predefined cross-talk condition is present.

15. An apparatus for providing oscillator signals, comprising:
an oscillator circuit configured to generate a first oscillator signal with a first oscillator signal frequency for a frequency conversion of a first signal to be converted and to generate a second oscillator signal with a second oscillator signal frequency for a frequency conversion of a second signal to be converted,
wherein the oscillator circuit is configured to enable the generation of the first oscillator signal with the first oscillator signal frequency and the second oscillator signal with the second oscillator signal frequency based on at least two different possible oscillator circuit configurations; and
a control circuit configured to select, based on the first oscillator signal frequency and the second oscillator signal frequency, one of the possible oscillator circuit configurations of the oscillator circuit for generating the first oscillator signal and the second oscillator signal,
wherein the control circuit is configured to select a possible oscillator circuit configuration based on a linear combination of the first oscillator signal frequency and the second oscillator signal frequency.

16. The apparatus according to claim 1, wherein the control circuit is configured to select a possible oscillator circuit configuration based on a baseband frequency bandwidth of an output baseband signal to be generated by the apparatus.

17. The apparatus according to claim 1, wherein the control circuit is configured to select a possible oscillator circuit configuration based on a linear combination of the first oscillator signal frequency and the second oscillator signal frequency by determining whether a linear combination of a product of a first frequency coefficient and a first oscillator signal frequency and a product of a second frequency coefficient and a second oscillator signal frequency falls below half of a baseband frequency bandwidth of an output baseband signal to be generated by the apparatus.

18. An apparatus for providing oscillator signals, comprising:
an oscillator circuit configured to generate a first oscillator signal with a first oscillator signal frequency for a frequency conversion of a first signal to be converted and to generate a second oscillator signal with a second oscillator signal frequency for a frequency conversion of a second signal to be converted;
a variable power supply module configured to supply at least one part of the oscillator circuit for providing the first oscillator signal or the second oscillator signal with adjustable power; and
a control circuit configured to control, based on the first oscillator signal frequency and the second oscillator signal frequency, a power supplied by the variable power supply module to the at least one part of the oscillator circuit.

19. The apparatus according to claim 18, wherein the control circuit is configured to control the power supplied by the variable power supply module based on a cross-talk related information indicating that a cross-talk is related to the least one part of the oscillator circuit.

20. The apparatus according to claim 19, wherein the cross-talk related information indicates that the cross-talk is related to the least one part of the oscillator circuit if a first frequency coefficient of the first oscillator signal frequency is not equal to a frequency division between a first controlled oscillator signal frequency and the first oscillator signal frequency and if a second frequency coefficient of the second oscillator signal frequency is not equal to a frequency division between a second controlled oscillator signal frequency and the second oscillator signal frequency.

21. The apparatus according to claim 18, wherein the oscillator circuit comprises a plurality of oscillator circuit components comprising at least one of a controlled oscillator module, a first frequency adjustment circuit and a distribution element for generating an oscillator signal, wherein the variable power supply module is configured to supply at least one oscillator component of the plurality of oscillator circuit components with adjustable power.

22. The apparatus according to claim 18, comprising a first plurality of oscillator circuit components for generating the first oscillator signal with the first oscillator signal frequency, and a second plurality of oscillator circuit components for generating the second oscillator signal with the second oscillator signal frequency,
wherein the variable power supply module is configured to supply increased or reduced power to at least one of the first plurality of oscillator circuit components and the second plurality of oscillator circuit components so that an amplitude of one of the first oscillator signal and the second oscillator signal is increased or reduced with respect to the other of the first and the second oscillator signal.

23. A method for providing oscillator signals, the method comprising:
generating a first oscillator signal with a first oscillator signal frequency for a frequency conversion of a first radio frequency receive signal and a second oscillator signal with a second oscillator signal frequency for a frequency conversion of a second radio frequency receive signal;
supplying at least one part of an oscillator circuit for providing the first oscillator signal or the second oscillator signal with adjustable power; and
controlling, based on the first oscillator signal frequency and the second oscillator signal frequency, a power supplied to the at least one part of the oscillator circuit.

\* \* \* \* \*